(12) United States Patent
Miyasaka

(10) Patent No.: US 7,251,010 B2
(45) Date of Patent: Jul. 31, 2007

(54) SEMICONDUCTOR CHIP AND DISPLAY DEVICE USING THE SAME

(75) Inventor: Daigo Miyasaka, Tokyo (JP)

(73) Assignee: NEC Corporation (JP)

( * ) Notice: Subject to any disclaimer, the term of this patent is extended or adjusted under 35 U.S.C. 154(b) by 129 days.

(21) Appl. No.: 11/077,031

(22) Filed: Mar. 11, 2005

(65) Prior Publication Data

US 2005/0205888 A1  Sep. 22, 2005

(30) Foreign Application Priority Data

Mar. 16, 2004  (JP) .............................. 2004-074364

(51) Int. Cl.
G02F 1/1345 (2006.01)
H01L 29/04 (2006.01)

(52) U.S. Cl. .................. 349/151; 349/152; 257/72; 257/59; 257/691; 257/786; 257/E33.058

(58) Field of Classification Search ............... 257/72, 257/59, 691, 786, E33.058; 349/151, 152
See application file for complete search history.

(56) References Cited

U.S. PATENT DOCUMENTS 6,037,654 A  3/2000 Tamura
7,072,018 B2* 7/2006 Yamamura et al. ......... 349/151
2001/0040664 A1* 11/2001 Tajima et al. ............... 349/150
2002/0018169 A1*  2/2002 Kato ........................... 349/149

FOREIGN PATENT DOCUMENTS

| JP | 11-031717 A | 2/1999 |
| JP | 2000-214477 A | 8/2000 |
| JP | 3235613 | 9/2001 |
| JP | 3235617 | 9/2001 |
| JP | 2002-124537 A | 4/2002 |
| JP | 2003-100982 A | 4/2003 |

* cited by examiner

*Primary Examiner*—Jerome Jackson
*Assistant Examiner*—Joseph Nguyen
(74) *Attorney, Agent, or Firm*—Dickstein, Shapiro, LLP.

(57) ABSTRACT

To realize an area reduction of a semiconductor chip without adding a process, and to provide a semiconductor chip structure having an excellent pressure balance when mounted.

In the structure of a semiconductor chip in which control/power supply lines are formed on a glass substrate, connecting terminals for electrically connecting with the control/power supply lines are provided in alignment in the longitudinal direction of the semiconductor device, whereby the wiring length within the semiconductor chip can be suppressed to be minimum. Since the wiring length is shortened, the width of the wirings within the semiconductor chip is narrowed, so that the area of the semiconductor chip is reduced.

17 Claims, 20 Drawing Sheets

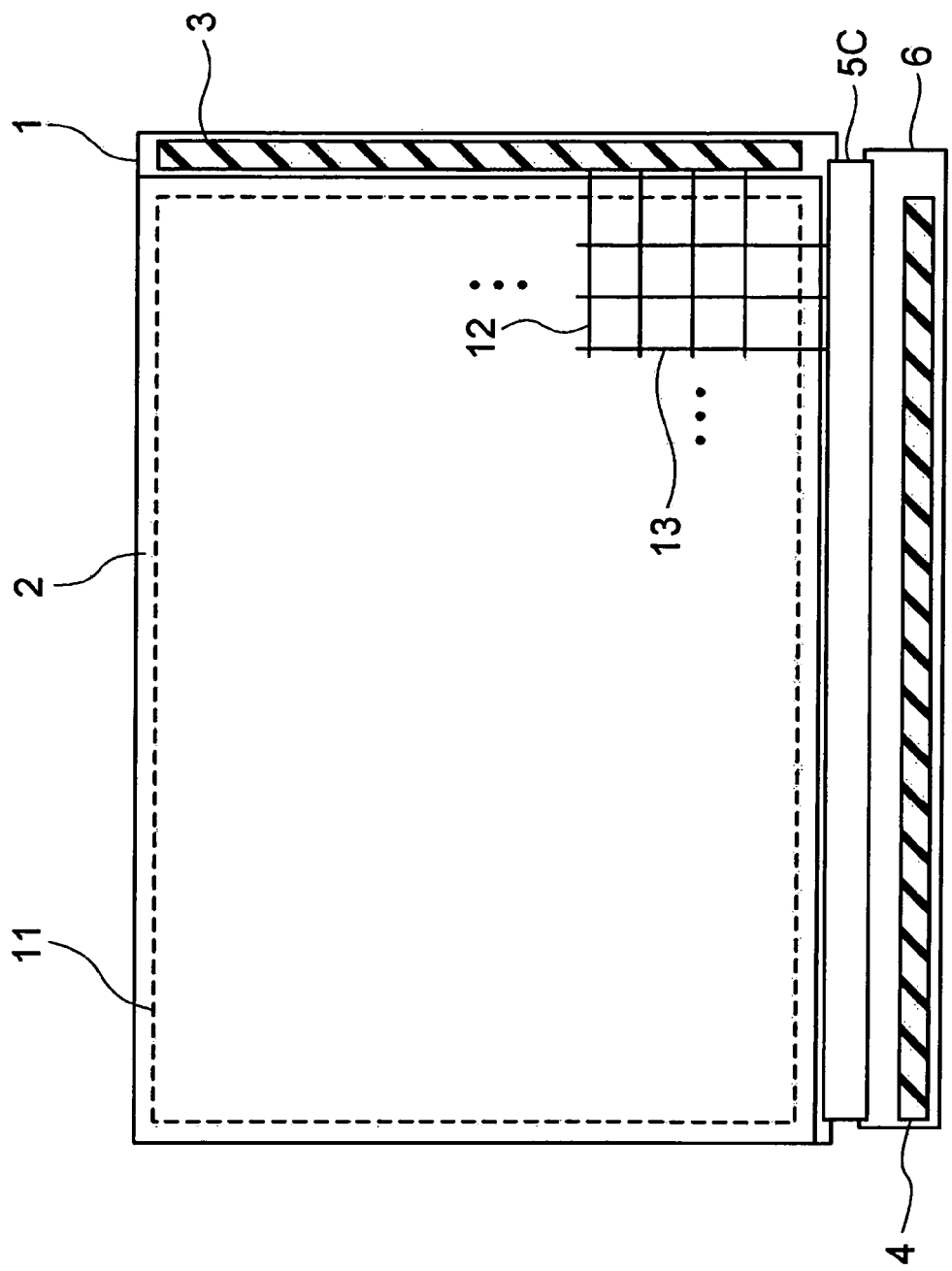

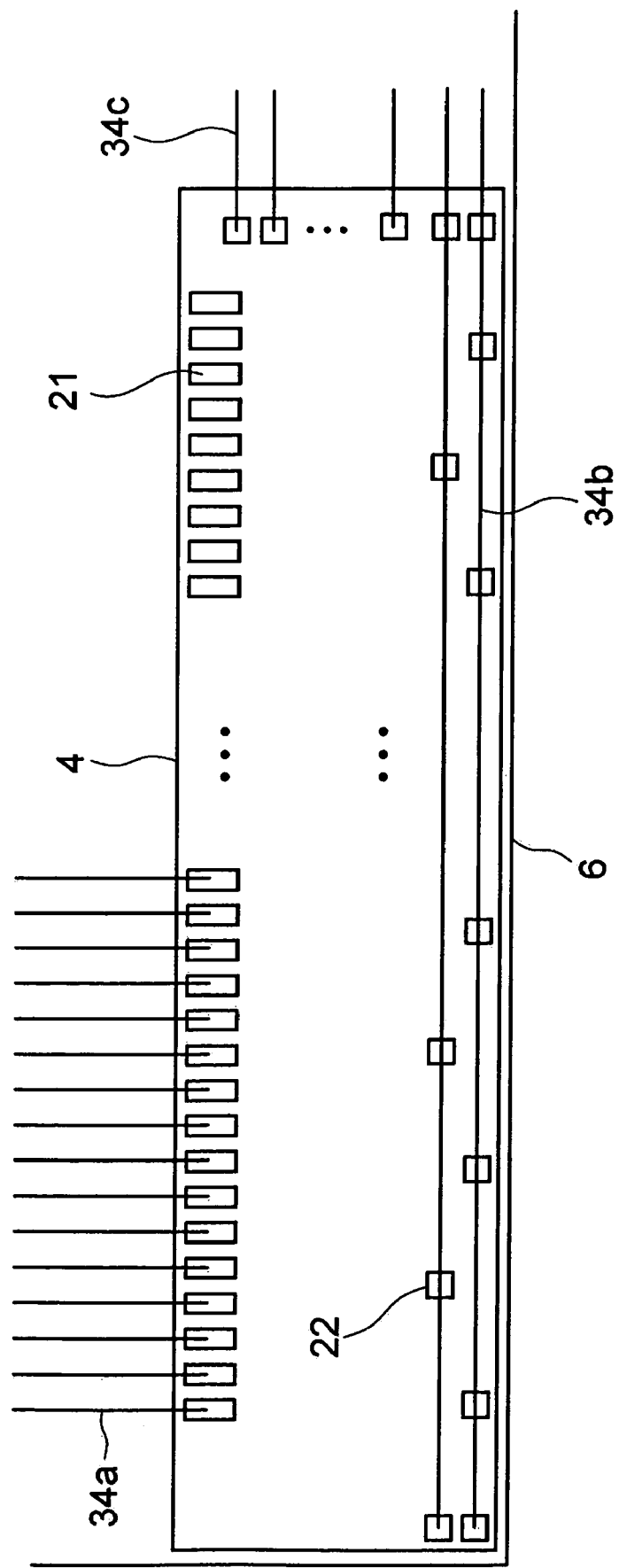

1

SEMICONDUCTOR CHIP AND DISPLAY DEVICE USING THE SAME

BACKGROUND OF THE INVENTION

1. Field of the Invention

The present invention relates to semiconductor chips having characteristics in the mounting structure and the connecting structure and a display device using the semiconductor chip, and in particular, to reduction of the areas of the semiconductor chips.

2. Related Art

Recently, display devices using liquid crystal, organic EL (electro-luminescence) or the like are used in various fields such as laptop-computers and mobile phones because of the thin and light characteristics. In order to further reduce the thickness, area and weight, it is required to reduce the area other than the display screen, that is, to narrow the frame part.

A display screen is provided with a display unit, the periphery of which is surrounded by the frame part on which semiconductor chips for driving pixels of the display unit are mounted. These semiconductor chips are mounted on the frame part of the display device by the technique such as TAB (Tape Automated Bonding) or COG (Chip On Glass). In any mounting technique, it is effective to reduce the areas of the semiconductor chips, in particular, to reduce the width of the semiconductor chips for narrowing the frame part and reducing the weight. Particularly, in the COG technique, protruded electrodes (bumps) of the semiconductor chips are directly connected with the frame part of the substrate of the display device by using an electrically conductive adhesive such as an anisotropic conductive film (ACF). Therefore, the width of the semiconductor chips directly affect in narrowing the frame part of the display device.

As conventional techniques for narrowing the frame part of a display device, two examples will be shown below. A first conventional technique is an example in which wiring of the frame part and the bump structure of a semiconductor chip are devised (see the Japanese Patent Application Laid-open No. 2003-100982, page 4 and FIG. 2), and a second conventional technique is an example in which the shape of a semiconductor chip itself is devised (see the Japanese Patent Application Laid-open No. 2000-214477, page 3 and FIG. 1).

In the first conventional technique, in a case where semiconductor chips are mounted on a glass substrate and wirings for driving them are deposited, wirings within a chip connected in parallel with a wiring for driving is provided in the housing of the semiconductor chip in order to suppress the wiring resistance, to thereby obtain a liquid crystal display device with a narrow frame part and high display quality.

However, in the case of the first conventional technique for reducing the area, although the width of the semiconductor chip can be reduced by providing low-resistance wirings on the semiconductor chip side, drawing area of the wirings from the terminals around the semiconductor chip is large, which only contributes a little for narrowing the frame part.

On the other hand, in the second conventional technique, a semiconductor chip for driving a display device consists of a glass substrate having a length similar to that of the screen, and a drive circuit is formed thereon which is connected onto the glass substrate for displaying, to thereby reduce the drawing area of the wirings on the glass substrate for displaying and to reduce the area of the mounting part of the drive circuit.

The second conventional technique has such a configuration that a semiconductor integrated circuit for driving is formed on the substantially whole area of the drive circuit glass substrate, and on the semiconductor integrated circuit for driving, connecting electrodes are stacked in such a manner as to be able to suppress noise via an insulating film. Thereby, the area of the mounting part of the drive circuit is reduced to thereby obtain a liquid crystal display device with a narrow frame part.

However, in the second conventional technique, although area reduction is achieved by adopting a drive circuit glass substrate whereby the drawing area of the wirings is reduced so that the narrow frame part is realized, connecting electrodes are stacked so as to be able to suppress noise on a semiconductor integrated circuit for driving via an insulating film. Therefore, the electrode arrangement may be subject to a large limitation, or there may be a need to add a process of forming an insulating film of a sufficient thickness. Further, dummy electrodes (dummy bumps) are not referred to, and terminals are formed so as to be concentrated on one edge of the drive circuit glass substrate.

Therefore, a main object of the present invention is, in a semiconductor chip structure mainly using a drive circuit glass substrate, to realize an area reduction of a semiconductor chip without adding a process, and to provide a semiconductor chip structure having an excellent pressure balance when mounted, and by using it, to provide a display device with a narrow frame part.

In order to achieve the object, a semiconductor chip according to the present invention comprises: a chip body formed in an elongated shape mounted on the frame part of a display device; a semiconductor circuit, mounted on the chip body, for driving either of signal lines or scan lines of a display unit provided in the display device; and a plurality of terminals provided on the chip body. The plurality of terminals are connected with at least one of a signal wiring or a power supply wiring of the display device formed on another substrate different from the chip body, and a plurality of terminals connected with the same wiring among the wirings are formed in alignment in the longitudinal direction of the chip body.

According to the present invention, since the wiring with which the plurality of terminals are connected is formed on another substrate, the size of the chip body is not affected by the width dimension of the wirings. Therefore, it is possible to reduce the size of the chip body irrespective of the width dimension of the wirings, and also to narrow the width dimension of the frame part of the display device on which the chip body is mounted.

Further, since the plurality of terminals connected to the same wiring among the wirings are formed in alignment in the longitudinal direction of the chip body, the length of the wiring connecting the plurality of terminals with each other can be made to be the shortest. Accordingly, assuming the cross-section area of the wiring is constant, the resistance value of the wirings becomes small substantially, so that the width dimension of the wiring can be narrowed. Further, since the width dimension of the wiring is narrowed, it is possible to reduce the size of the other substrate. Relating to this effect, the width dimension of the frame part of the display device can be narrowed.

In the present invention, the positions of the terminals connected with adjacent wirings among the wirings may be shifted to each other in the longitudinal direction of the chip body such that intervals between the plurality of terminals connected with the same wiring are reduced.

With this configuration, the intervals between the plurality of terminals are reduced, so that the length of the wiring becomes shorter substantially. This enables to narrow the width dimension of the frame part of the display device as described above.

Further, in the present invention, the semiconductor circuit may include output terminals which are connected with the signal lines or the scan lines and are arranged in alignment near one long edge of the chip body. The terminals formed in alignment in the longitudinal direction of the chip body are terminals for supplying at least either of signals or power to the semiconductor circuit, and may be arranged near the other long edge opposite the one long edge of the chip body.

With this configuration, when the semiconductor chip is mounted on the frame part, the opposing two long edges of the chip body are supported by the plurality of terminals formed in alignment in the longitudinal direction of the chip body and the output terminals.

Accordingly, the long edge side of the chip body will never be damaged by a force applied to the semiconductor chip. Moreover, since there is no need to add dummy bumps to the chip body in addition to the terminals, it is possible to reduce the size of the chip body so as to narrow the frame part. Further, the present invention may be so configured that the chip body is divided into a plurality of pieces, and another signal wiring and power supply wiring are provided so as to pass through spaces between the terminals formed in alignment in the longitudinal direction of the chip body and the output terminals. Further, the present invention may be so configured that the chip body includes an inner circuit which generates at least either of a power supply voltage or signals, and wirings connected with the inner circuit is provided so as to pass through spaces between the terminals formed in alignment in the longitudinal direction of the chip body and the output terminals. Further, the plurality of rows of terminals, each of which is formed of the plurality of terminals connected to the same wiring, may be spaced apart in a direction along the long edge side of the chip body.

Further, assuming that the area of the terminal is X, the number of the terminals is n, the wiring length of the wiring extending in the longitudinal direction of the chip body is L, the average width of the wiring is W, the minimum width of the wiring affordable in the producing process of the semiconductor chip is W1, and the wiring formed on the other substrate and the wiring formed on the chip body are made of the same material, it is desirable that the number n of the terminals satisfy $n<(WL/X)(1/2)$ or $n<W/W1$.

As the other substrate, a substrate provided in the display device in which the chip body is mounted, a flexible wiring board provided in parallel with the chip body, or a flexible wiring board on which the chip body is mounted is used. Note that a printed board may be used instead of the flexible wiring board.

Further, a display device using the semiconductor chip of the present invention comprises: a display unit formed inside the frame part of the display device; a plurality of pixels which are formed within the display unit and are drive-controlled by drive signals from the signal lines and the scan lines; and the semiconductor chip mounted on the frame part surrounding the display unit. The terminals provided on the semiconductor chip are connected to corresponding signal lines, scan lines, signal wirings, and power supply wirings provided in the display device, respectively.

By using the semiconductor chip according to the present invention as described above, it is possible to realize a display device with a narrower frame.

BRIEF DESCRIPTION OF THE DRAWINGS

FIG. 19 is a plan view showing the liquid crystal display device of the sixth embodiment of the present invention, having a configuration in which a semiconductor chip is mounted on a printed board; and FIG. 20 is a plan view showing a semiconductor chip for driving signal lines, of the sixth embodiment of the present invention, mounted on the liquid crystal display device having a configuration in which a semiconductor chip is mounted on the printed board.

PREFERRED EMBODIMENTS OF THE INVENTION

A first embodiment of the present invention will be explained below by way of examples referring to a plan view of a liquid crystal display device shown in FIG. 1 and to the configurations of semiconductor chips shown in FIGS. 2 and 3.

Figure 1:
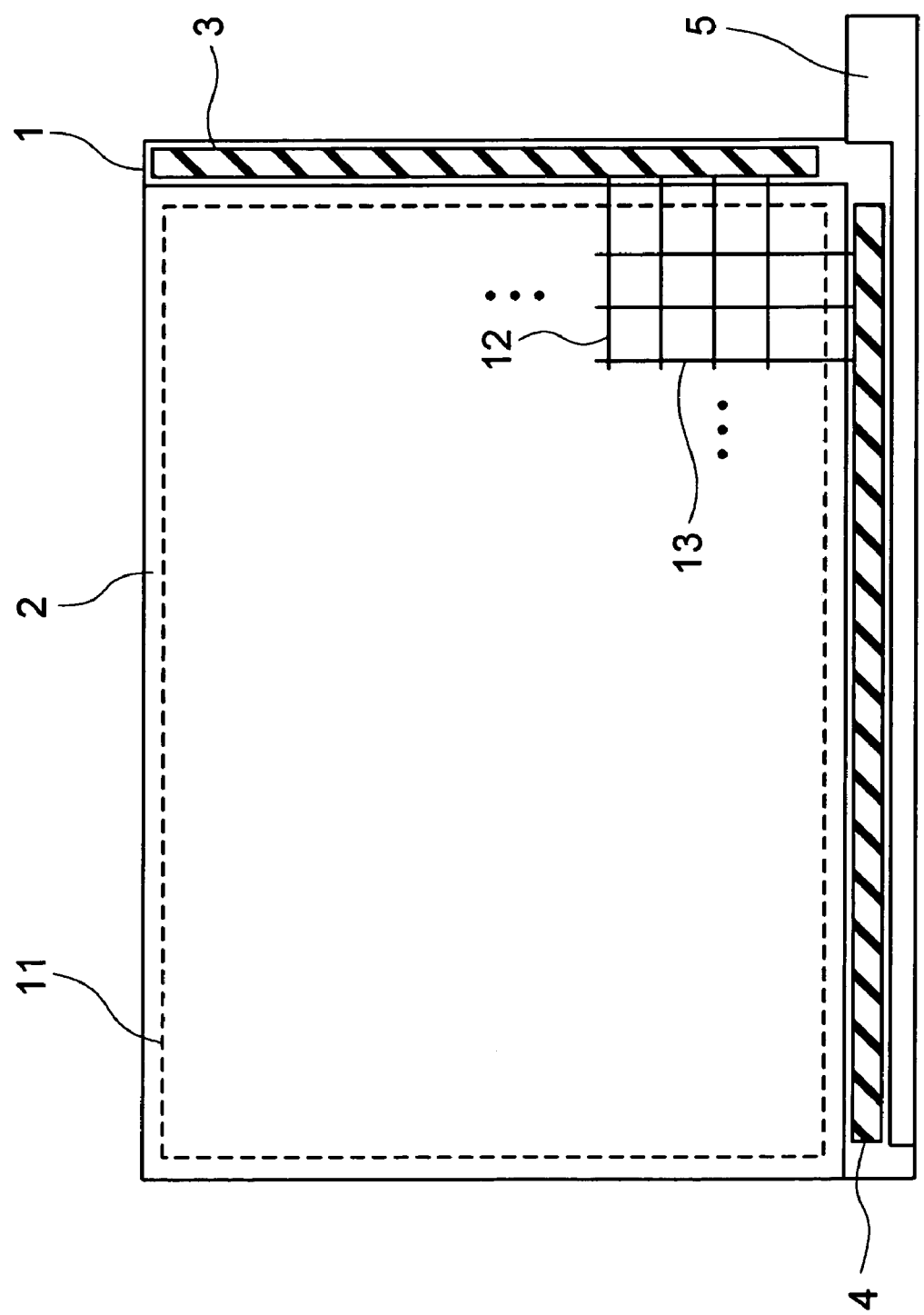
FIG. 1 is a plan view showing a liquid crystal display device of a first embodiment of the present invention.

In the liquid crystal display device shown in FIG. 1, a first substrate 1 and a transparent second substrate 2 are opposed to each other with a liquid crystal layer (not shown) interposed between them, and are bonded together with a sealant. As the first substrate 1 and the transparent second substrate 2, glass substrates are mainly used. Of course, plastic substrates may be used provided that a liquid crystal display device is realized.

The outer size of the first substrate 1 is larger than that of the transparent second substrate 2. In FIG. 1, the right edge and the lower edge of the first substrate 1 are projected from the second substrate 2, forming a frame part on which semiconductor chips are mounted. On the frame part, semiconductor chips 3 and 4, marked by diagonal lines in FIG. 1, are mounted via an ACF. The semiconductor chips 3 and 4 are provided with semiconductor circuits C1 and C2 for driving liquid crystal, the details of which will be described later. On the first substrate 1, a flexible wiring board 5 for inputting signals and power for driving the liquid crystal display device is mounted in parallel with the semiconductor chip 4. Although not shown, signals from the flexible wiring board 5 are sent to the semiconductor chips 3 and 4 and the like thorough wirings provided on the first substrate 1.

An area shown by a dotted line in FIG. 1 is a display unit 11 formed on the first substrate 1. The display unit 11 includes: a plurality of scan lines 12 and signal lines 13, crossing each other, formed on the first substrate 1; a plurality of pixels formed at positions where the scan lines 12 and the signal lines 13 cross; and transparent electrodes formed on the transparent second substrate 2. The plural pixels have thin film transistors (TFTs) for drive-controlling.

The semiconductor chip 3 for driving scan lines, which controls signals outputted to the plural scan lines 12, and the semiconductor chip 4 for driving signal lines, which controls signals outputted to the plural signal lines 13, are connected to the scan lines 12 and the signal lines 13, respectively, so as to drive the pixels of the display unit 11.

Figure 2:
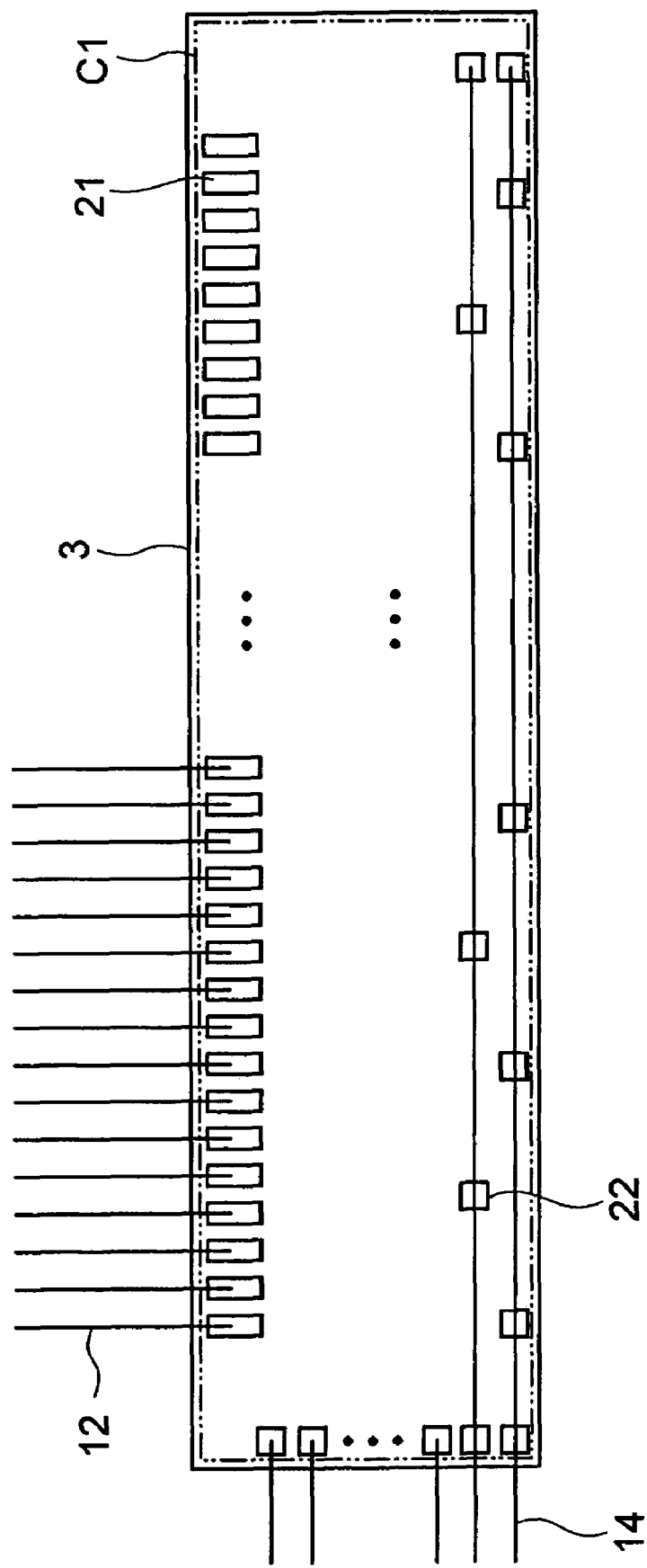
FIG. 2 is a plan view showing a semiconductor chip for driving scan lines of the first embodiment of the present invention.

FIG. 2 is a plan view of the semiconductor chip 3 shown in FIG. 1 viewed from above of the sheet. The semiconductor chip 3 is face-down mounted on the frame part, whereby output terminals 21 and connecting terminals 22 shown in FIG. 2 are provided on the mounting face side to the first substrate 1 of the semiconductor chip 3. The output terminals 21 and the connecting terminals 22 are protruded electrodes. The output terminals 21 correspond to output terminals of a semiconductor circuit (hereinafter referred to as a drive circuit) C1, and the connecting terminals 22 correspond to input terminals of the drive circuit C1.

The plate-shaped chip body, which is the base of the semiconductor chip 3 shown in FIG. 2, is formed to be an elongated shape (strip) as shown, and the plural output terminals 21 are formed in alignment in the longitudinal direction of the strip chip body. The plural output terminals 21 are aligned near a long edge of the display unit 11 side of the chip body. Further, connecting terminals 22, corresponding to the input terminals of the semiconductor chip, are provided in alignment along a long edge (right edge in this case) opposite the long edge along which the output terminals 21 of the semiconductor chip 3 are formed. Further, the some connecting terminals 22 are provided so as to be aligned near a short edge of the chip body. The connecting terminals 22 are connected with control/power supply lines 14 for driving the semiconductor chip 3. The control/power supply lines 14 are formed on the first substrate 1.

Figure 3:
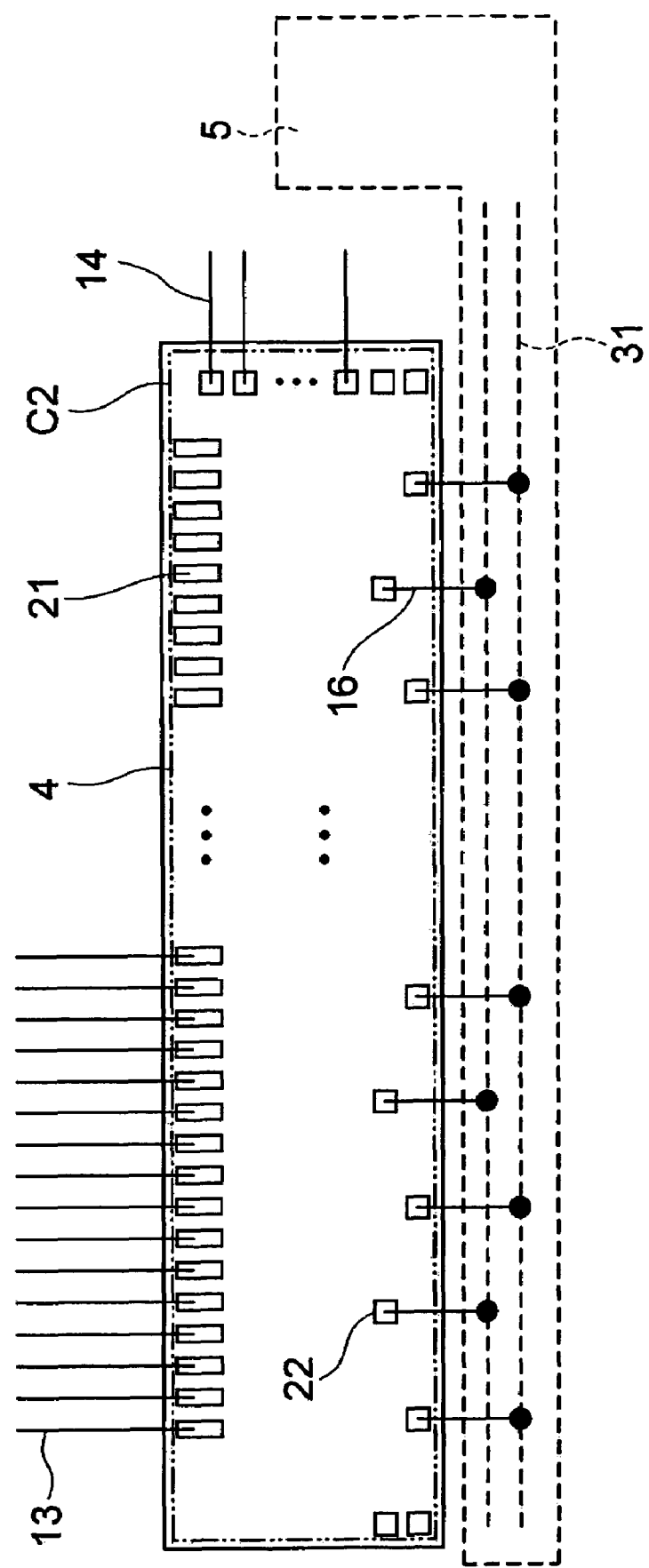
FIG. 3 is a plan view showing a semiconductor chip for driving signal lines of the first embodiment of the present invention.

FIG. 3 is a plan view of the semiconductor chip 4 shown in FIG. 1 viewed from above of the sheet. As shown in FIG. 3, a plate-shaped chip body, which is the base of the semiconductor chip 4, is formed to be an elongated shape. The chip body is so formed that a drive circuit C2 as a semiconductor circuit is mounted on one face thereof, and output terminals 21 and input terminals (connecting terminals) 22 of the drive circuit C2 are mounted on the other face thereof. The semiconductor chip 4 is mounted on the first substrate 1 side such that the other face of the chip body faces the first substrate 1. The plural output terminals 21 and the plural connecting terminals 22 are formed in alignment near long opposing edges of the chip body, respectively. Further, some connecting terminals 22 are formed in alignment near a short edge of the chip body.

Further, on a long edge side of the chip body, a flexible wiring board 5 is provided in parallel therewith. The connecting terminals 22 formed along the short edge side of the chip body are connected with the control/power supply lines 14 on the first substrate 1, and the connecting terminals 22 formed along the long edge side of the chip body are connected with corresponding flexible wirings 31 on the flexible wiring board 5 via junction lines 16, respectively. Here, the control/power supply lines 14 and the flexible wirings 31 correspond to wirings for signals/power supply for drive-controlling the semiconductor chip 4.

Next, a case of applying the semiconductor chips 3 and 4 of the present embodiment to a display device will be explained.

As shown in FIG. 1, the semiconductor chips 3 and 4 are mounted on the frame part of the display unit 11. The semiconductor chip 3 is provided for driving the scan lines 12, and the semiconductor chip 4 is provided for driving the signal lines 13. The length of the semiconductor chip 3 is set to be the longitudinal length of the display unit 11, and the length of the semiconductor chip 4 is set to be the lateral length of the display unit 11.

As shown in FIG. 2, the control/power supply lines 14 are formed in the longitudinal direction of the frame part of the first substrate 1 on which the semiconductor chip 3 is mounted. The output terminals 21 of the semiconductor chip 3 are connected with the scan lines 12 of the display unit 11, respectively, and the connecting terminals 22 are connected with the control/power supply lines 14, respectively, and the semiconductor chip 3 is mounted on the frame part of the display unit 11.

As shown in FIG. 3, on the flexible wiring board 5 provided in parallel with the semiconductor chip 4, the flexible wirings 31 are formed along the longitudinal direction thereof. The flexible wirings 31 correspond to signal wirings/power supply wirings for supplying signals and power supply voltage to the drive circuit C2 of the semiconductor chip 4. The output terminals 21 of the semiconductor chip 4 are connected with the signal lines 13 of the display unit 11, respectively, and the connecting terminals 22 are connected with the flexible wirings 31 (control/power supply lines 14) via the junction lines 16, respectively, and the semiconductor chip 4 is mounted on the frame part of the display unit 11.

The areas of drawn wirings for connection from the output terminals 21 of the semiconductor chips 3 and 4 to the scan lines 12 and the signal lines 13 decrease as the pitches of the output terminals 21 become close to the pitches of the scan lines 12 and the signal lines 13. Therefore, it is desirable to make these pitches as close as possible. Further, the semiconductor chips 3 and 4 are mounted on the narrow frame part of the display unit 11 and are provided with the semiconductor circuits C1 and C2. Considering such a restricted structure, it is desirable to form the semiconductor circuits C1 and C2 on the glass substrates directly, and to adopt a manufacturing method of cutting out the glass substrate so as to have an elongated shape appropriate for the frame part of the display unit 11. A method in which only the semiconductor circuits C1 and C2 of the semiconductor chips 3 and 4 are formed on the glass substrates and the semiconductor circuits C1 and C2 are mounted on separate chip bodies may be adopted. However, when comparing with this method, the method of cutting out is advantageous regarding the number of semiconductor chips 3 and 4 cut out from one glass plate, and the manufacturing cost, for example. Further, a first effect of the present invention is that a wiring area which can be removed from the chip increases as the wirings are required to be extended in the longitudinal direction, and the effect is large.

As for the chip bodies of the semiconductor chips 3 and 4 shown in FIGS. 2 and 3, the semiconductor circuits C1 and C2 (drive circuits) are formed on the substantially whole surfaces of the chip bodies so as to make the chip width minimum. The power supply voltage required for the drive circuits drops larger as getting far from the power source. Accordingly, in order to reduce the resistance value per unit of the control/power supply line 14, it is required to enlarge the width dimension of the control/power supply line 14, that is, to enlarge the cross-sectional area of the control/power supply line 14. On the other hand, the frame part of the display unit 11 is required to reduce the width. Therefore, there is a limitation in narrowing the dimension in the short edge direction of the semiconductor chips 3 and 4.

In view of the above, on the semiconductor chip 3 shown in FIG. 2, the control/power supply lines 14 connected to the connecting terminals 22 are formed on the substrate 1 of the display unit 11. On the semiconductor chip 4 shown in FIG. 3, the control/power supply lines 14 (flexible wirings 31) connected to the connecting terminals 22 are formed on the flexible wiring board 5 provided in parallel with the chip body. Then, the connecting terminals 22 and the flexible wirings 31 of the semiconductor chip 4 are connected via the junction lines 16.

Since the control/power supply lines 14 are formed on other substrates 1 and 5 different from the chip bodies, the sizes of the chip bodies are not affected by the width dimension of the control/power supply lines 14. Accordingly, the size of the chip body can be reduced irrespective of the width dimension of the control/power supply line 14, whereby the width dimension of the frame part, of the display unit 11, on which the chip bodies are mounted can be narrowed.

The width dimension of the frame part formed in the edge part of the substrate 1 is a dimension at least required for mounting the semiconductor chip 3. Therefore, enlarging the width dimension of the control/power supply lines 14 of the substrate 1 within the dimensional range does not affect the characteristics of the display unit 11. Accordingly, by enlarging the width dimension of the control/power supply lines 14 formed on the substrate 1, the resistance value of the control/power supply line 14 can be reduced, so that the voltage drop to the respective connecting terminals 22 of the semiconductor chip 3 along with the control/power supply lines 14 can be suppressed to be small, comparing with the conventional case.

Further, the flexible wiring board 5 formed in parallel with the semiconductor chip 4 is provided for supplying signals and power supply voltage to the semiconductor chip 4. Therefore, enlarging the width dimension of the control/power supply line 14 of the substrate 1 within the dimensional range does not affect the characteristics of the flexible wiring board 5. Accordingly, by enlarging the width dimension of the control/power supply line 14 formed on the wiring board 5, the resistance value of the control/power supply line 14 can be reduced, so that the voltage drop to the respective connecting terminals 22 of the semiconductor chip 4 along with the control/power supply lines 14 can be suppressed to be small, comparing with the conventional case.

The voltage drop from the connecting terminals 22 of the semiconductor chips 3 and 4 to the semiconductor circuits C1 and C2 (drive circuits) becomes minimum by narrowing the intervals of the connecting terminals 22, so the intervals of the connecting terminals 22 are set to be narrow in the present embodiment. More specifically, as shown in FIGS. 2 and 3, the plural connecting terminals 22 of the semiconductor chips 3 and 4 are connected with adjacent control/power supply lines 14 at regular intervals along with the longitudinal direction of the chip bodies, respectively. The positions of the plural terminals 22 connected to the adjacent lines 14, among the control/power supply lines 14, are shifted to each other in the longitudinal direction of the chip bodies (longitudinal direction of the line 14) so as to reduce the intervals between the plural terminals 22 connected with the same line 14. Since the intervals between the plural terminals 22 are narrowed, the lengths of the lines 14 are shortened substantially, so that the resistance value of the line 14 can be small. This means that the cross-sectional area of the line 14 (diameter size of the line 14) is made to be small substantially. As a result, the dimensions of the short edges of the semiconductor chips 3 and 4 can be narrowed, whereby the frame part of the display unit 11 on which the semiconductor chips 3 and 4 are mounted can be narrowed.

In view of the above, it is possible to calculate the number of pieces of the plural terminals 22 connected to the same line 14 based on a formula. In this case, it is desirable to increase the number of connecting terminals 22 up to the point where, by comparing an increase in circuit area due to the increase in the number of connecting terminals 22 with a decrease in the circuit area due to the decrease in wiring width, the latter becomes larger.

A specific calculation method will be given below. In the case of FIG. 2, this calculation method is based on the premise that the material of the control/power supply lines 14 formed on the substrate 1 of the display unit 11 and that of wirings other than the lines 14, not shown but formed on the chip body of the semiconductor chip 3, are the same. Further, in the case of FIG. 3, this calculation method is based on the premise that the material of the control/power supply lines 14 formed on the flexible wiring board 5 and that of wirings other than the lines 14, not shown but formed on the chip body of the semiconductor chip 3, are the same.

It is assumed that the area of the connecting terminals 22 is X, the number of the connecting terminals 22 is n, the wiring length of the wirings 14, extending in the longitudinal direction, formed on the substrates 1 and 5 is L, and the average width of the wirings 14 is W. When n=1, the width of the wiring within the semiconductor chip is considered to be W at most. Then, when n=1, the width of the wiring within the semiconductor chip is assumed to be W. At that time, if the number of the connecting terminal 22 is increased by one from n, in order to make the voltage drop from the plural terminals 22 to the semiconductor circuits C1 and C2 become the same, the width of the wiring is changed from W/n to W/(n+1). Accordingly, the area decrease in the semiconductor circuits C1 and C2 due to wiring width reduction becomes larger than the area increase of the semiconductor circuits C1 and C2 due to an increase in the connecting terminals 22 when the following formula is satisfied:

$$X < \{W/n - W/(n+1)\}L$$

If n is sufficiently larger than 1, the number of the connecting terminals 22 may be set so as to satisfy the following formula:

$$N < \sqrt{(WL/X)}$$

On the other hand, for the width of the wiring within the semiconductor chip, the minimum value is set because of the limitation of the process rule. Assuming that the minimum value is W1, it is contributed to the reduction of the areas of the semiconductor circuits C1 and C2 by setting the number of connecting terminals 22 so as to satisfy the following formula:

$$n < W/W1$$

Next, an explanation will be given for a specific example in which positions of the plural terminal 14 connected to the adjacent lines 14 among the control/power supply lines 14 respectively are shifted to each other in the longitudinal direction of the chip body (longitudinal direction of the line 14) as described above.

If the wirings 14 extending in the longitudinal direction of the semiconductor chip are power supply lines, the number of the wirings is at least two for power supply voltage and for ground. In this case, when the terminals 22 connected to the two lines 14 are arranged in matrix, the plural terminals 22 result in being arranged at positions where they face each other in the short edge direction of the semiconductor chips 3 and 4. In order to avoid such a situation, the plural terminals 22 connected with the adjacent lines 14 respectively are arranged in zigzags. More specifically, in between two terminals 22 connected with one line 14, one terminal 22 connected to the other line 14 is arranged, so that the plural terminals 22 are arranged in zigzags.

Figure 4:
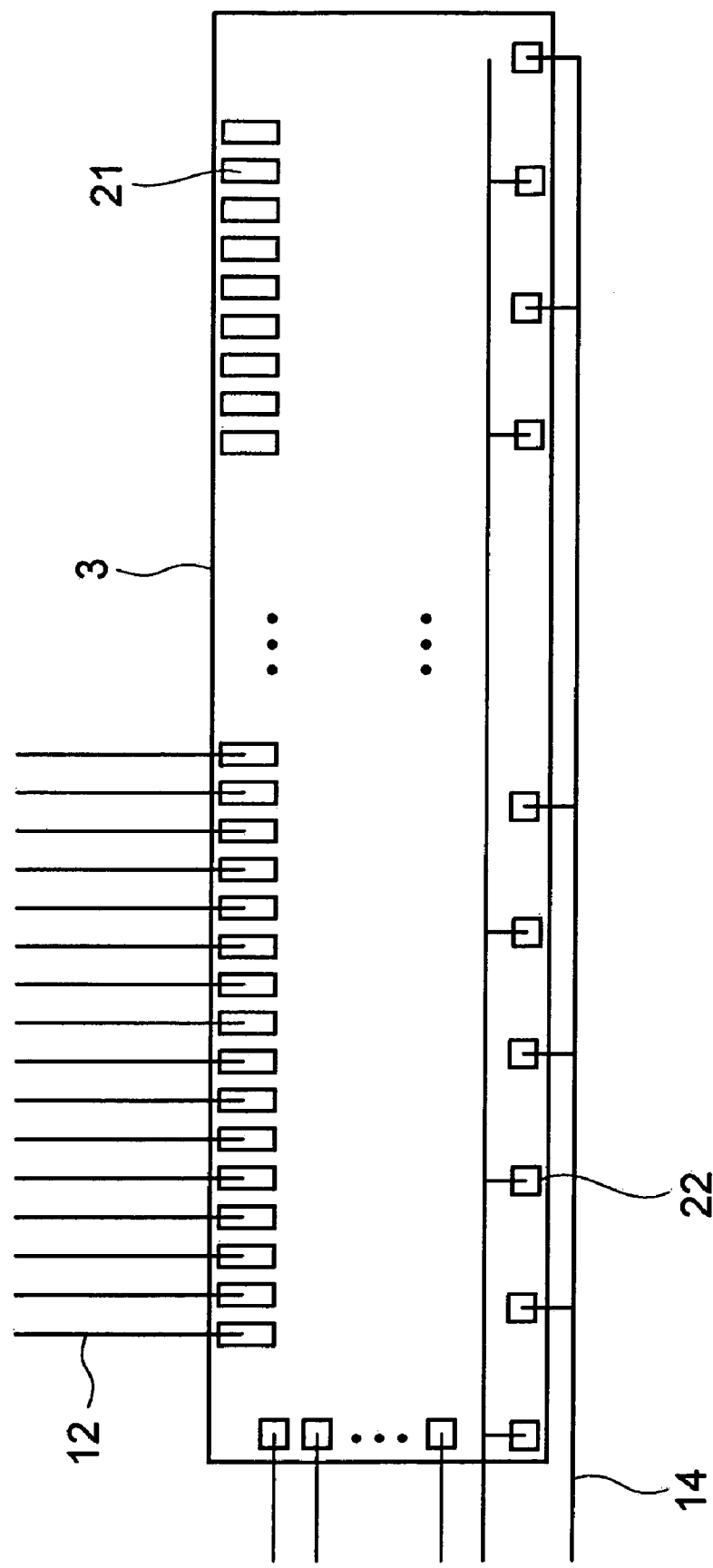
FIG. 4 is a plan view showing another connecting example of wiring to the semiconductor chip for driving scan lines according to the first embodiment of the present invention.

In an example shown in FIG. 4, the plural terminals 22 connected with the respective adjacent lines 14 are arranged alternately (nested state) in the longitudinal direction of the chip body of the semiconductor chip 3.

Figure 5:
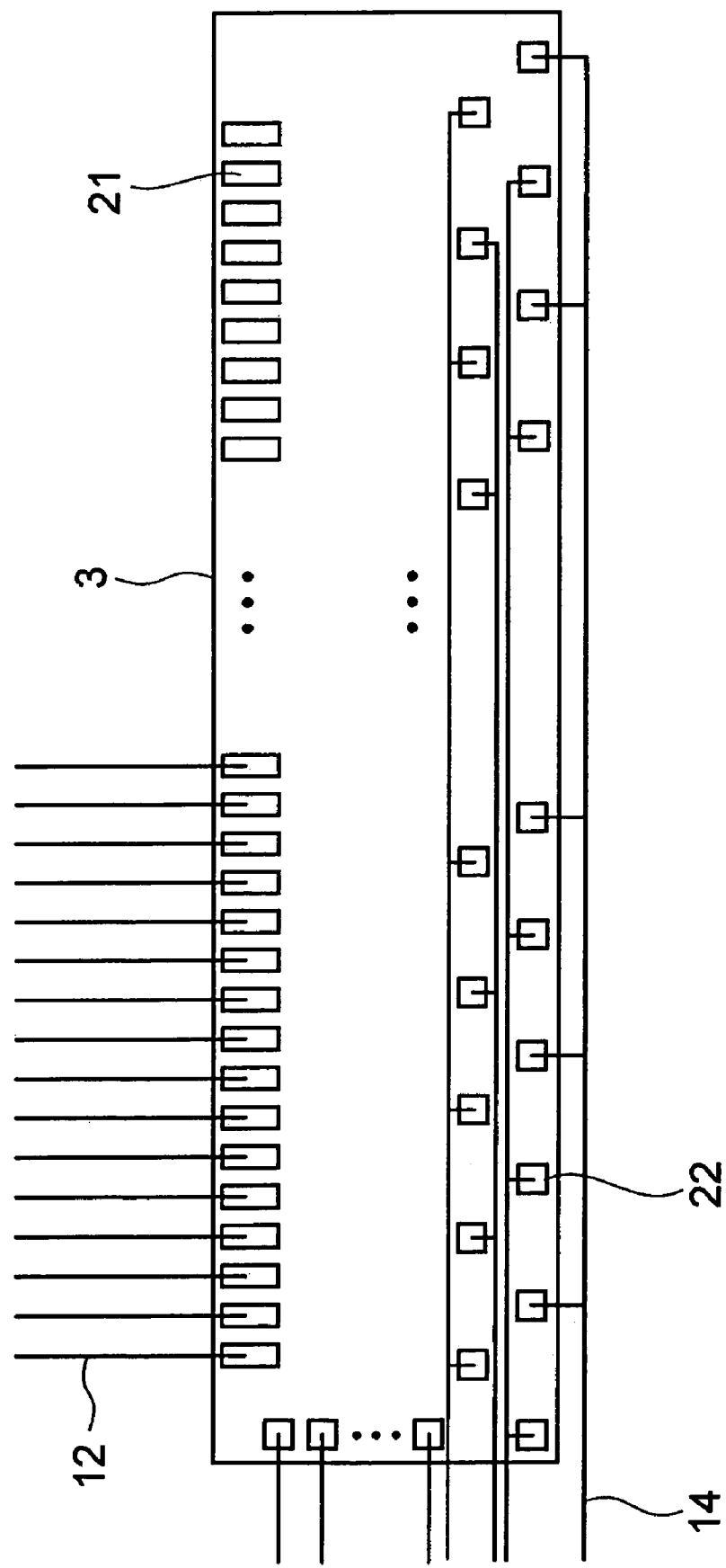
FIG. 5 is a plan view showing another connecting example of wiring to the semiconductor chip for driving scan lines according to the first embodiment of the present invention.

Further, for the semiconductor chip 3 for driving scan lines, voltage for turning on the gates of the TFTs for drive-controlling the pixels of the display unit 11 and voltage for turning off the gates are further required. If these voltages are supplied from the outside, four power supply lines 14 are required as shown in FIG. 5. In this case, the plural terminals 22 connected with the respective adjacent lines 14 are arranged(nested state, cyclically) in the longitudinal direction of the chip body of the semiconductor chip 3 as shown in FIG. 4, whereby the four power supply lines 14 are arranged in parallel as shown in FIG. 5. With this configuration, even when the power supply lines 14 are increased to four lines, the plural connecting terminals 22 can be formed without increasing the forming area beyond necessity.

Figure 6:
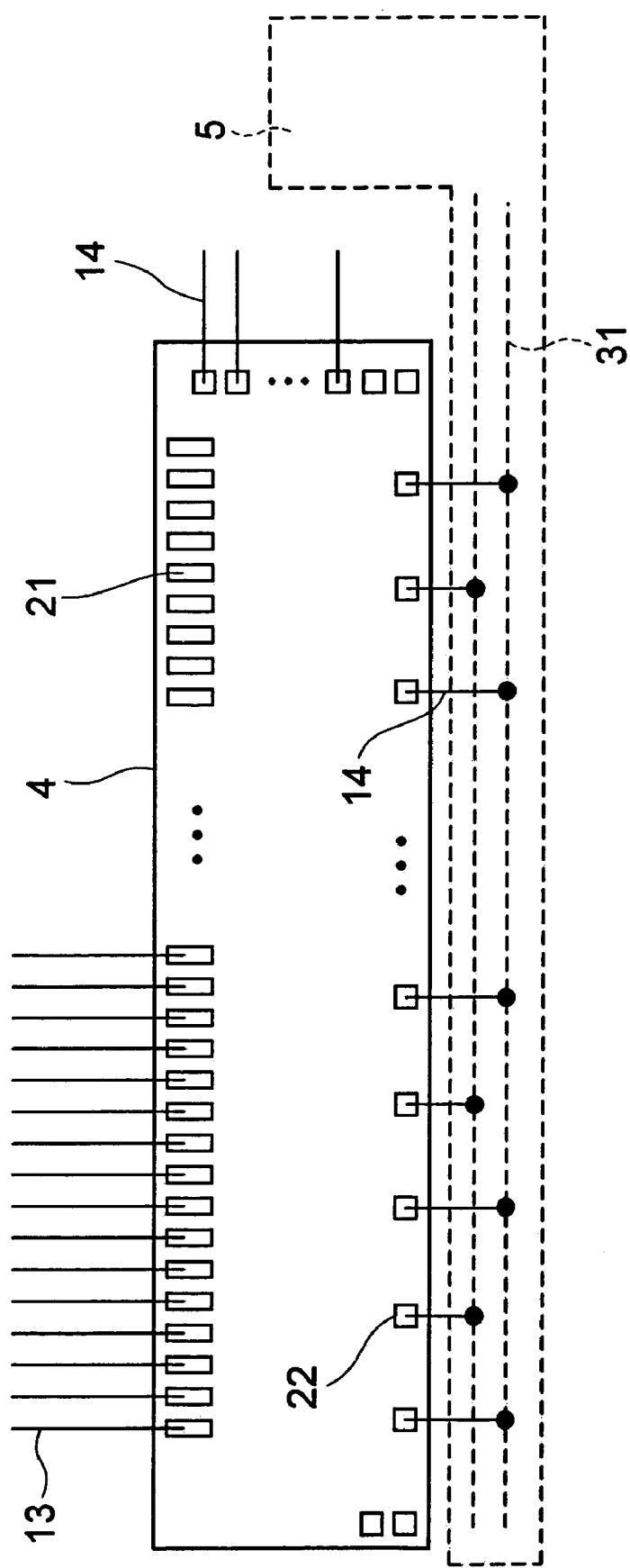
FIG. 6 is a plan view showing another connecting example of wiring to the semiconductor chip for driving signal lines according to the first embodiment of the present invention.

The arrangement of connecting terminals 22 of the semiconductor chip 4 shown in FIG. 3 is the same as that of the connecting terminals 22 of the semiconductor chip 3 shown in FIG. 2. However, since the current consumption is larger in the semiconductor chip 4 for driving signal lines comparing with that of the semiconductor chip 3 for driving scan lines, the flexible wirings 31 corresponding to low resistance wirings are provided adjacent to the semiconductor chip 4. Even in this configuration, the intervals of the connecting terminals 22 may be reduced so that the voltage drop in the power supply lines within the semiconductor chip 4 becomes small. Further, the connecting terminals 22 along the long edge of the semiconductor chip 4 shown in FIG. 3 are arranged in zigzags. Instead of the arrangement shown in FIG. 3, a similar effect can be achieved with such an arrangement that plural connecting terminals 22 connected with different flexible wirings 31 of the flexible wiring board 5 are arranged alternately in one line in the longitudinal direction of the semiconductor chip 4 as shown in FIG. 6. However, in an example shown in FIG. 6, when the number of flexible wirings 31 increases, the intervals between the plural connecting terminals 22 become narrow, so that there may be a case where insulation between the connecting terminals 22 is impossible to be secured. In view of this case, the plural terminals 22 connected with the plural wirings 31 shown in FIG. 7 respectively are arranged in zigzags so as to cope with an increase in the number of flexible wirings 31.

Although the case of using both of the control lines 14 for supplying signals such as drive signals and control signals to the semiconductor circuits C1 and C2 and the power supply lines 14 for supplying power supply voltage to the semiconductor circuits C1 and C2 have been explained as wirings extending in the longitudinal direction of the semiconductor chips, the present invention can be applied in a similar manner when either the control lines 14 or the power supply lines 14 are used.

With the configuration described above, it is possible to narrow the widths of the wirings within the semiconductor chips 3 and 4 without adding a new process to the manufacturing process of the semiconductor chips 3 and 4, and to reduce the size of the semiconductor chips 3 and 4.

Next, a second effect that dummy bumps are not required will be explained. As described in FIGS. 2 and 3, on the semiconductor chip 3 for driving scan lines and the semiconductor chip 4 for driving signal lines, the plural connecting terminals 22 connected with the control/power supply lines 14 are arranged in alignment in the longitudinal direction of the chip bodies. The output terminal 21 in FIGS. 2 and 3 are terminals for outputting drive signals from the semiconductor circuits C1 and C2 on the chip bodies to the scan lines 12 and signal lines 13, and are arranged along one long edge of the chip bodies. Further, the plural connecting terminals 22 are provided in alignment along the longitudinal direction of the chip bodies. Now, the rows of the output terminals 21 and the rows of the connecting terminals 22 are provided along the two opposing long edges of the chip bodies such that they come close to each other respectively.

When the semiconductor chip 3 and 4 are mounted on the frame part of the display unit 11, a force is applied to the semiconductor chips 3 and 4. The force may damage the semiconductor chips 3 and 4 if the force is applied in a biased manner to the semiconductor chips 3 and 4. However, in this configuration in which the rows of the output terminals 21 and the rows of the connecting terminals 22 are provided on the two opposing long edges of the chip bodies such that they come close to each other, the force is received equally distributively by the terminals 21 and 22, so that the semiconductor chips 3 and 4 are protected against the force. Further, since the pressure balance against the force can be maintained by the terminals 21 and 22, there is no need to form dummy bumps additionally and to add a new manufacturing process. Moreover, it is possible to reduce the size of the chip bodies.

From a viewpoint of not requiring dummy bumps, it is desirable that the connecting terminals 22 be provided in areas besides the areas near the both ends of the long edges. The number n of the connecting terminals 22 is set to be not less than three, that is, n>2. The connecting terminals 22 of the number of n>2 are arranged at positions where they are capable of distributively supporting the force applied to the semiconductor chips 3 and 4.

As described above, it is possible to narrow the width of the wirings within the semiconductor chips and to provide a semiconductor chip structure with narrow width. Further, it is also possible to achieve an effect, exhibited by the connecting terminals in the conventional example, same as that of dummy bumps, that is, equalizing the pressure balance when mounting in cooperation with the output terminals. This makes areas for dummy bumps unnecessary, and enables to provide a semiconductor chip structure with narrow width.

Further, with the aforementioned two effects, it is possible to provide a display device with a narrower frame.

Figure 8:
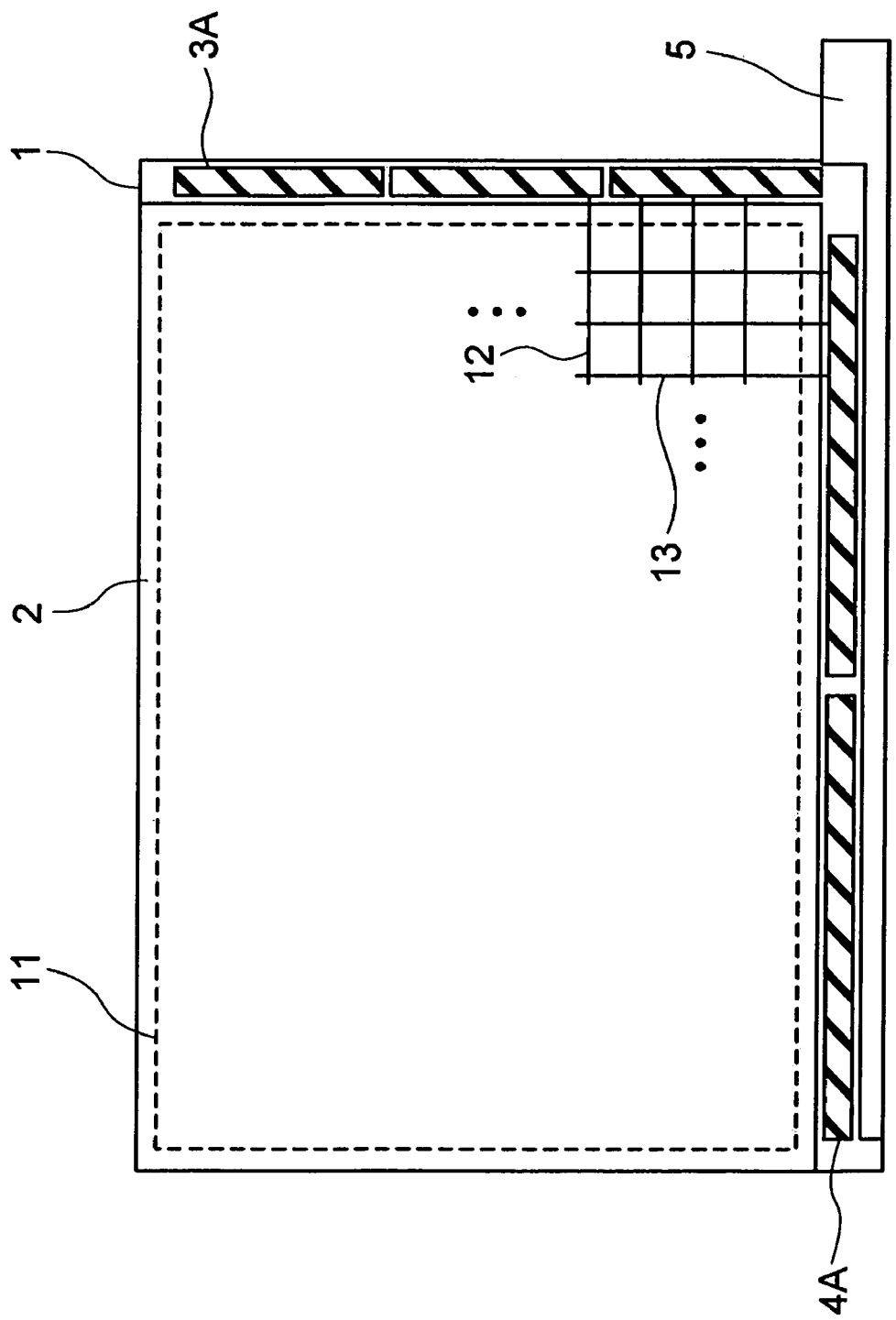
FIG. 8 is a plan view showing a liquid crystal display device of a second embodiment of the present invention.

Next, a second embodiment of the present invention will be explained in detail with reference to the drawings. FIG. 8 is a plan view showing a liquid crystal display device of the second embodiment of the present invention, and FIGS. 9 and 10 show a plan view of the semiconductor chip shown in FIG. 8, and a connecting relationship with wirings.

The aspect different from FIG. 1 showing the first embodiment is that a semiconductor chip 3A for driving scan lines and a semiconductor chip 4A for driving signals lines are divided into plural pieces, respectively. Other aspects in the configuration and operation are the same as those of the first embodiment.

Figure 7:
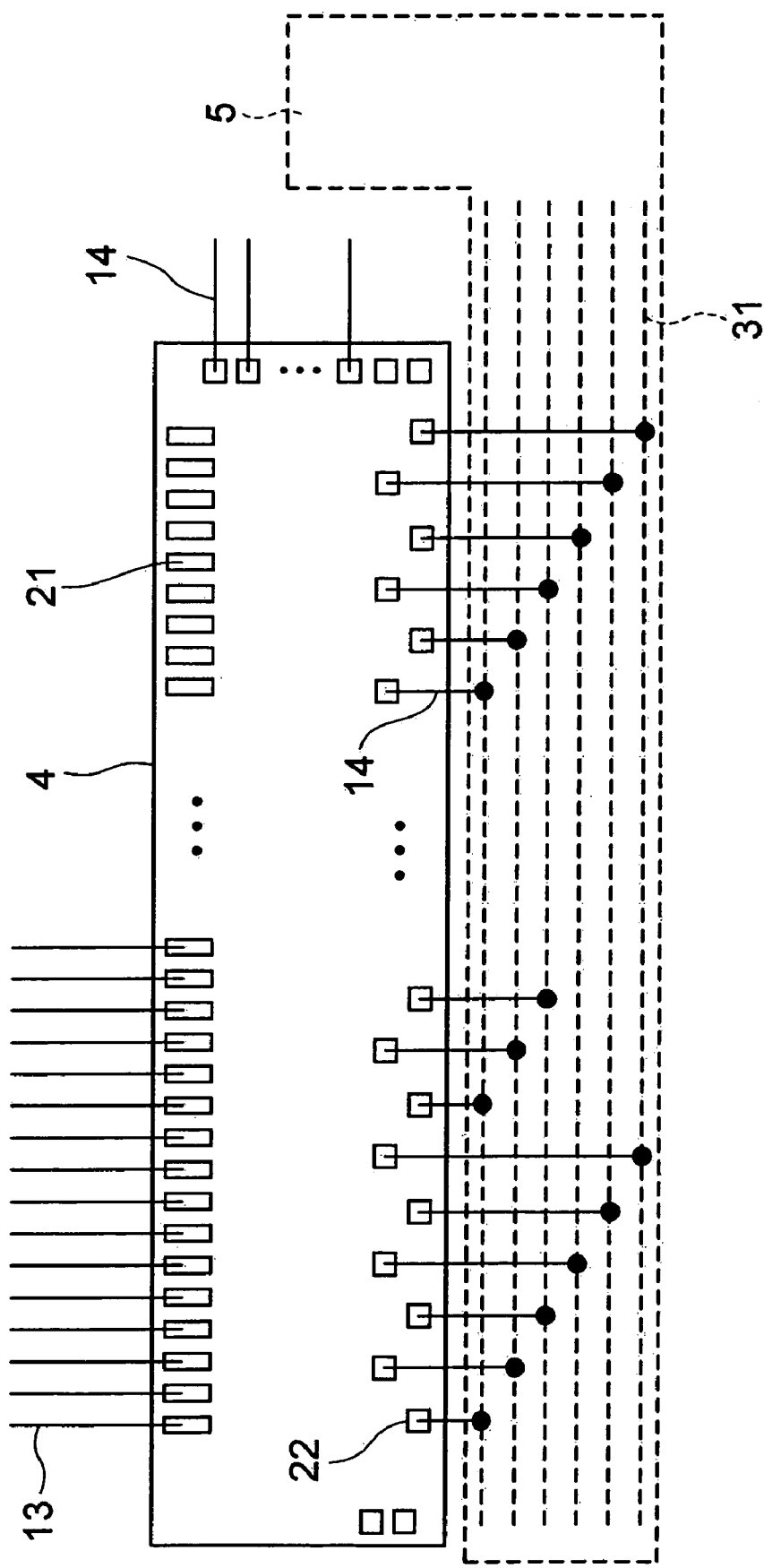
FIG. 7 is a plan view showing another connecting example of wiring to the semiconductor chip for driving signal lines according to the first embodiment of the present invention.
Figure 9:
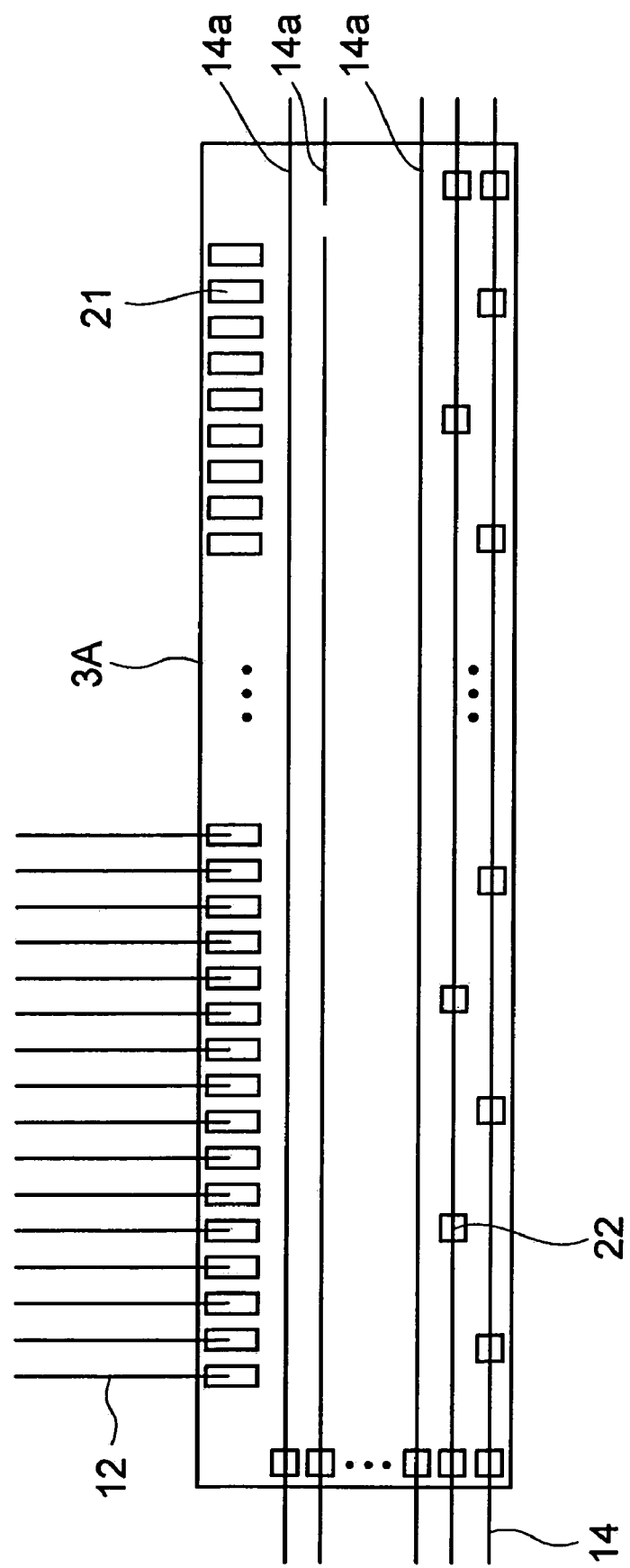
FIG. 9 is a plan view showing a semiconductor chip for driving scan lines of the second embodiment of the present invention.
Figure 10:
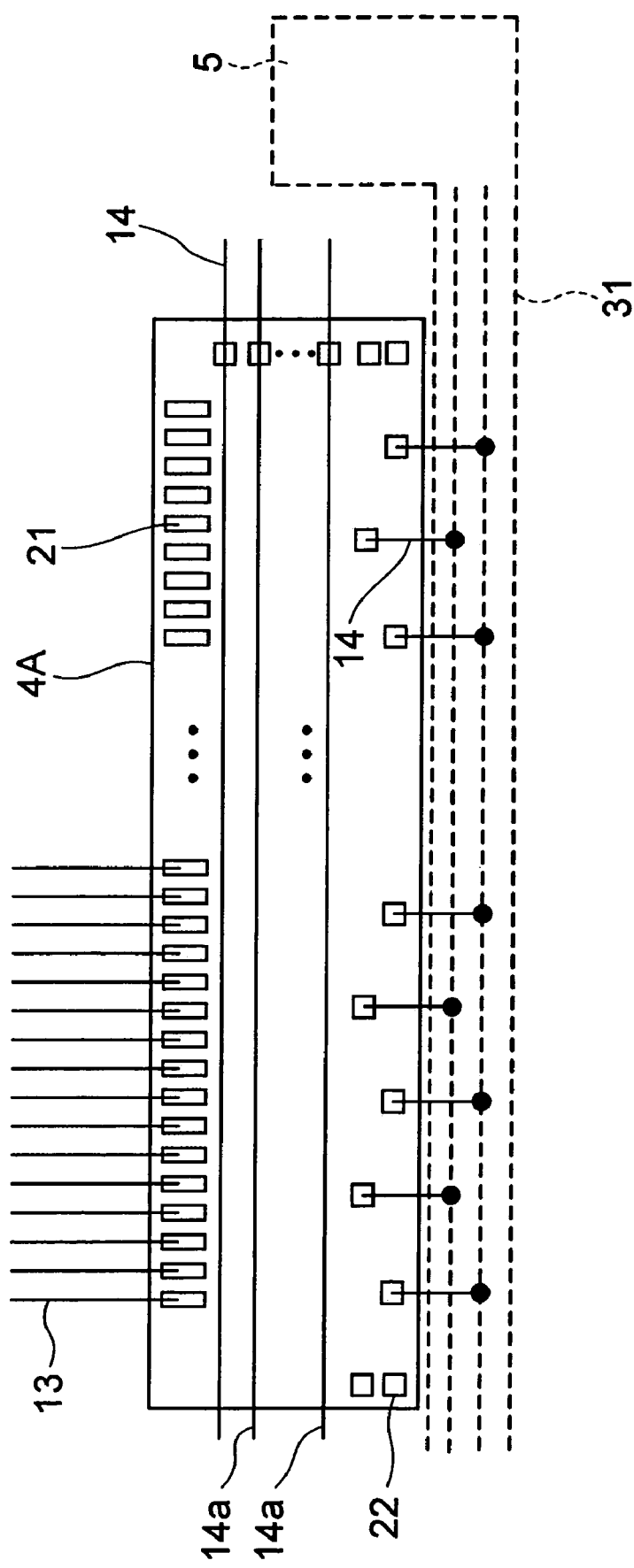
FIG. 10 is a plan view showing a semiconductor chip for driving signal lines of the second embodiment of the present invention.

Although the semiconductor chips 3A and 4A are configured to be divided respectively as shown in FIG. 7, the respective control/signal lines 14 formed on the first substrate 1 pass between the output terminals 21 and the connecting terminals 22 formed along the long edges of the semiconductor chips 3A and 4A as shown in FIGS. 9 and 10, whereby the display device can be configured without the frame becoming wider.

In this way, the present invention can be applied even when the semiconductor chips are divided into plural semiconductor chips 3A and 4A.

As described above, it is possible that the control/power supply lines 14a connected with the connecting terminals 21 of the other semiconductor chip are wired by using free spaces formed between the semiconductor chips 3A and 4A divided into plural pieces. Therefore, the semiconductor chips 3A and 4A will never be enlarged due to the presence of the control/power supply lines 14a.

Figure 11:
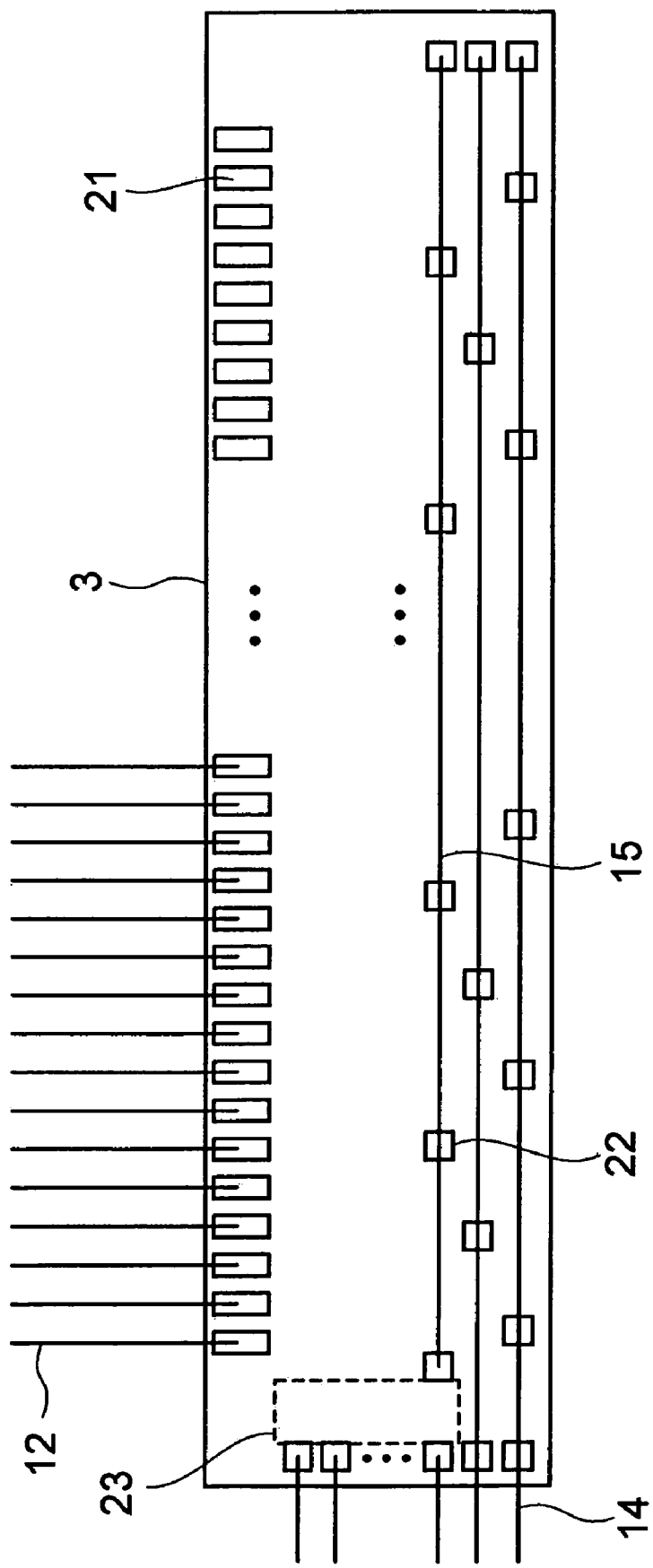
FIG. 11 is a plan view showing a semiconductor chip for driving scan lines of a third embodiment of the present invention, showing the connecting relationship between wiring and terminals.

A third embodiment of the present invention will be described in detail with reference to the drawings. FIG. 11 shows the structure of a semiconductor chip according to the third embodiment of the present invention. The aspect different from the semiconductor chip of the first embodiment shown in FIG. 2 is that at least an inner wiring 15, formed on the first substrate 1, used for connection within the semiconductor chip 3 and an inner circuit 23 for supplying signals, power supply voltage and the like to the inner wiring 15 are provided, in addition to the control/power supply lines 14 extending in the longitudinal direction of the semiconductor chip 3. Other aspects in the configuration and operation are the same as those of the first embodiment. Further, the semiconductor chip 3 shown in FIG. 11 can be applied to the liquid crystal display device of FIG. 1 when taking into account the aforementioned changes, and the operation thereof is the same as that of the first embodiment.

In the inner circuit 23, a signal (or power supply voltage) inputted from at least a part of the control/power supply lines 14 through the connecting terminals 22 is processed. The processed signal (or power supply voltage) are again sent from another connecting terminal 22 to the connecting terminals 22 aligned in the longitudinal direction of the semiconductor chip 3 through the inner wiring 15 formed on the first substrate 1.

With the aforementioned configuration, it is possible to narrow the wiring width provided within the semiconductor chip 3 by using the wirings formed on the first substrate 1 via the connecting terminals 22 again for signals which have been processed within the semiconductor chip 3 (internally generated signals). As an example adopting such a configuration, a case of generating power supply voltage inside such as a DC-DC converter is considered.

As described above, since the plural connecting terminals 22 connected with the inner wiring 15 from the inner circuit 23 are aligned along the longitudinal direction of the chip body, it is possible to narrow the width dimension of the semiconductor chip 3. Accordingly, the width dimension of the frame part of the display unit 11 can also be reduced.

Further, with the aforementioned two effects, it is possible to provide a display device with a narrower frame.

Figure 12:
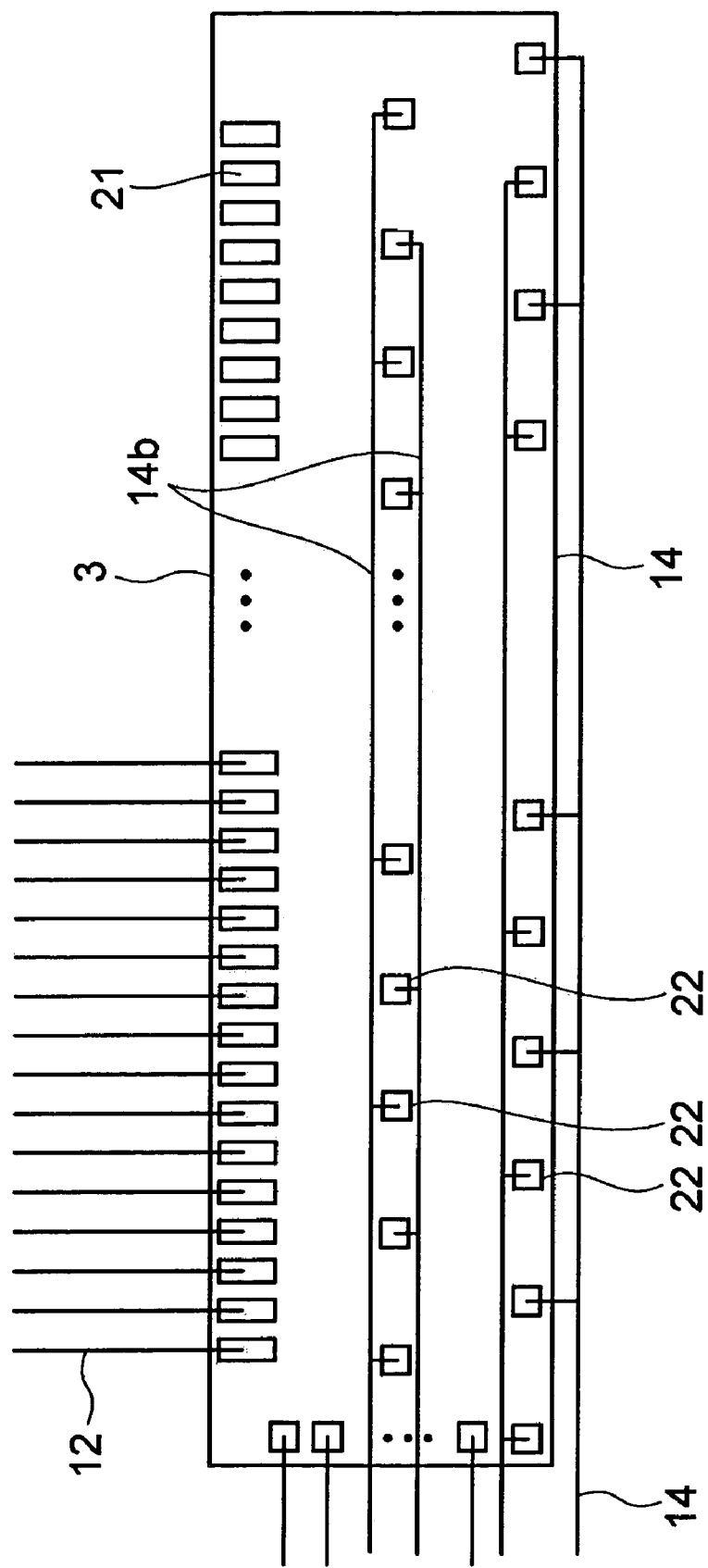
FIG. 12 is a plan view showing a semiconductor chip for driving scan lines of a fourth embodiment of the present invention, showing the connecting relationship between wiring and terminals.

A fourth embodiment of the present invention will be explained in detail with reference to the drawings. FIG. 12 shows the structure of a semiconductor chip according to the fourth embodiment of the present invention. The aspect different from the semiconductor chip shown in FIG. 5, which is another connecting example 2 of the first embodiment, is as follows. That is, although four control/power supply lines 14 are provided in a biased manner along one long edge side in the example shown in FIG. 5, in the present embodiment, two control/power supply lines 14b are arranged so as to be spaced apart from the other two control/power supply lines 14 along a direction of the short edge side of the chip body. Since the control/power supply lines 14b are placed at substantially intermediate position between the output terminals 21 and the other control/power supply lines 14, the semiconductor chip 3 is supported by the terminals 21 and 22 at the two long edge sides and the center part thereof. Therefore, it is possible to equally distribute the force applied to the semiconductor chip 3 when it is mounted on the display unit 11, by the terminals 21 and 22. Consequently, the semiconductor chip 3 is protected against the force.

Other aspects in the configuration and operation are the same as those of the first embodiment. Further, the semiconductor chip 3 shown in FIG. 12 can be applied to the liquid crystal display device of FIG. 1 when taking into account the aforementioned changes, and the operation thereof is the same as that of the first embodiment.

As shown in FIG. 12, if the arrangement of connecting terminals 22 has more freedom so that the connecting terminals 22 can be placed at more appropriate positions, the wiring length within the semiconductor chip 3 can be reduced. Thereby, it is possible to reduce the width of the semiconductor chip 3.

Accordingly, it is possible to narrow the width of the wiring within the semiconductor chip 3, and since the connecting terminals 22 serve as dummy bumps, the structure of the semiconductor chip 3 with the narrow width can be provided.

Further, with the aforementioned two effects, it is possible to provide a display device with a narrower frame.

Figure 13:
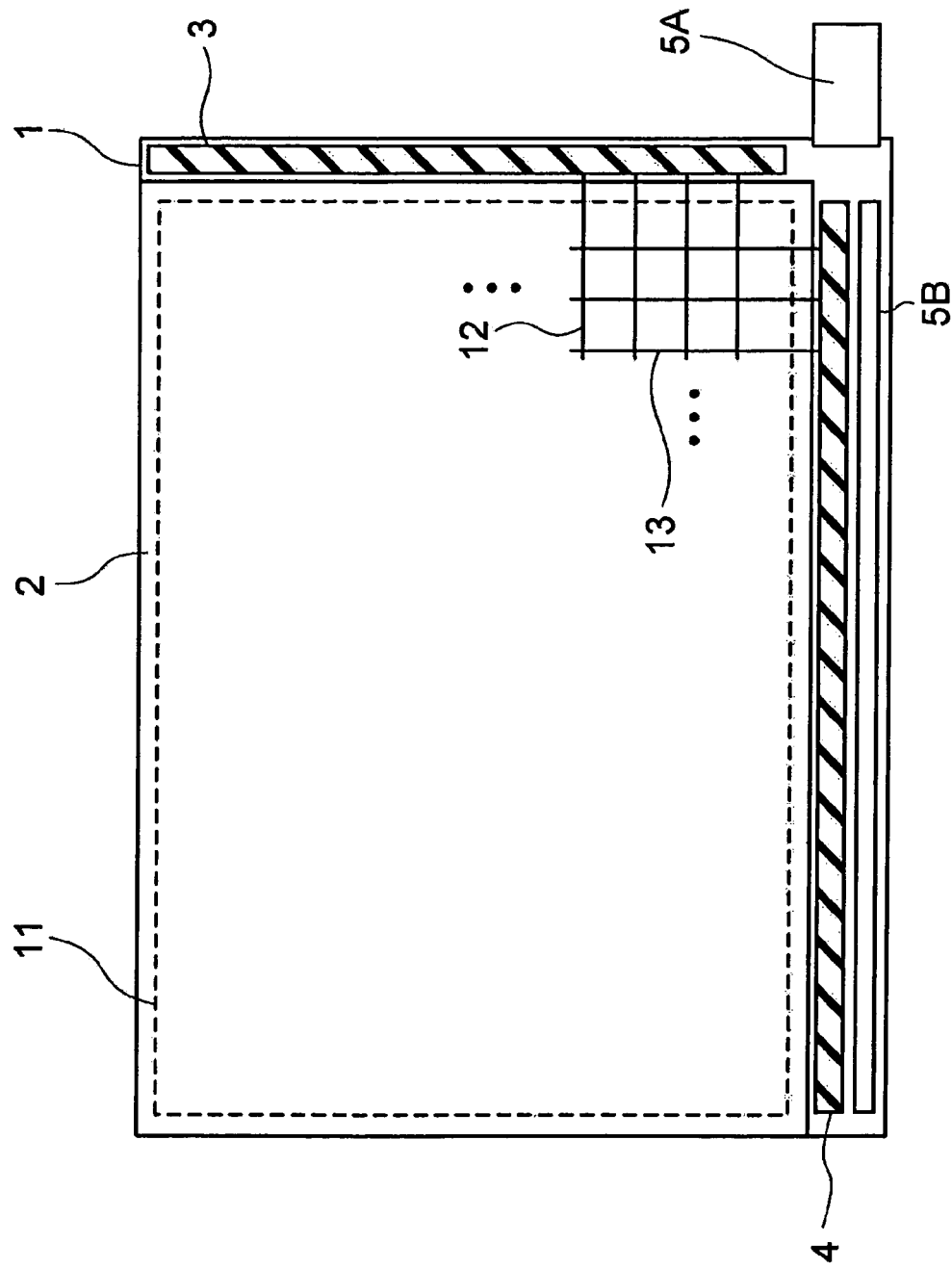
FIG. 13 is a plan view showing a liquid crystal display device of a fifth embodiment of the present invention.

A fifth embodiment of the present invention will be described in detail with reference to the drawings. FIG. 13 is a plan view of a liquid crystal display device according to the fifth embodiment of the present invention, and FIG. 14 is a plan view of the structure of the semiconductor chip 4 for driving signal lines shown in FIG. 13, showing the connecting relationship with the wirings.

The aspect different from FIG. 1 showing the first embodiment is that the flexible wiring board is divided into a flexible wiring board 5A and a flexible wiring board 5B. The flexible wiring bard 5A inputs signals from the outside to the first substrate 1. On the flexible wiring board 5B, there are provided flexible wirings 31 connected with the control/power supply lines 14 extending from the connecting terminals 22 aligned along a long edge of the semiconductor chip 4 for driving signal lines. Other aspects in the configuration and operation are the same as those of the first embodiment.

Figure 14:
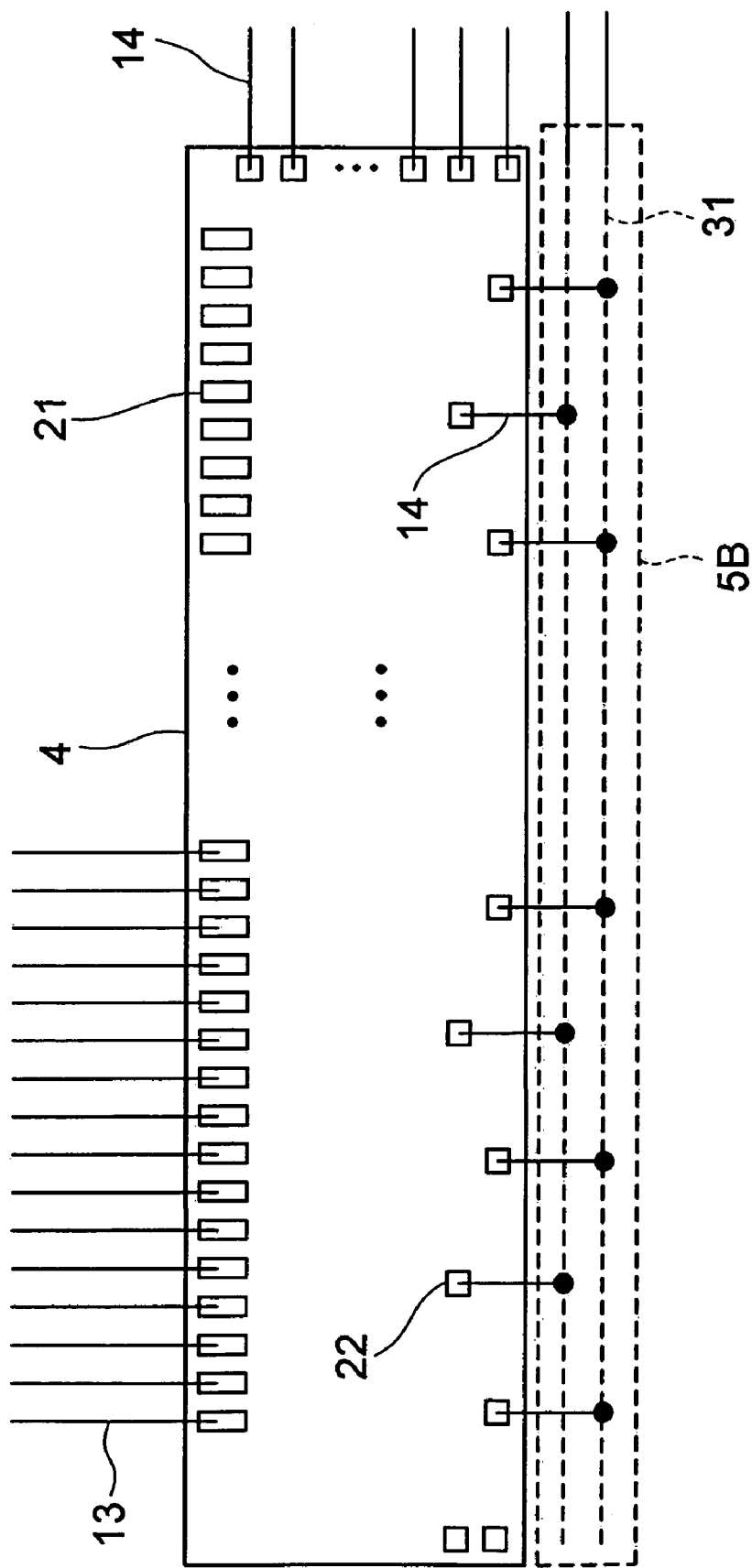
FIG. 14 is a plan view showing a semiconductor chip for driving signal lines of the fifth embodiment of the present invention.

As shown in FIGS. 13 and 14, the cost may be reduced by providing the divided flexible wiring boards. The cost of flexible wiring boards is affected by the number of pieces taken per unit sheet, and it is considered that the number of pieces taken per unit sheet is large in the case of simple structure such as square.

Note that in this case, the semiconductor chip is not limited to a semiconductor chip having a longitudinal dimension of the frame of the display unit 11, but may be one in which semiconductor chips divided into plural pieces are combined as shown in FIG. 8.

With the configuration described above, it is possible to narrow the width of the wirings within the semiconductor chips 3 and 4, and since the connecting terminals 22 serve as dummy bumps, it is possible to provide the structure of the semiconductor chips 3 and 4 with narrow widths. Further, with the aforementioned two effects, it is possible to provide a display device with a narrower frame.

As for the first to fifth embodiments, embodiments in which the semiconductor chips are mounted on the substrate 1 of the display unit 11 are mainly explained. However, the present invention is not limited to these embodiments. In a sixth embodiment, another embodiment, more specifically, one in which semiconductor chips are mounted on a flexible wiring board or a printed board, will be explained. The first and second effects of the present invention can be achieved by providing the wirings on those other than glass substrates.

Figure 15:
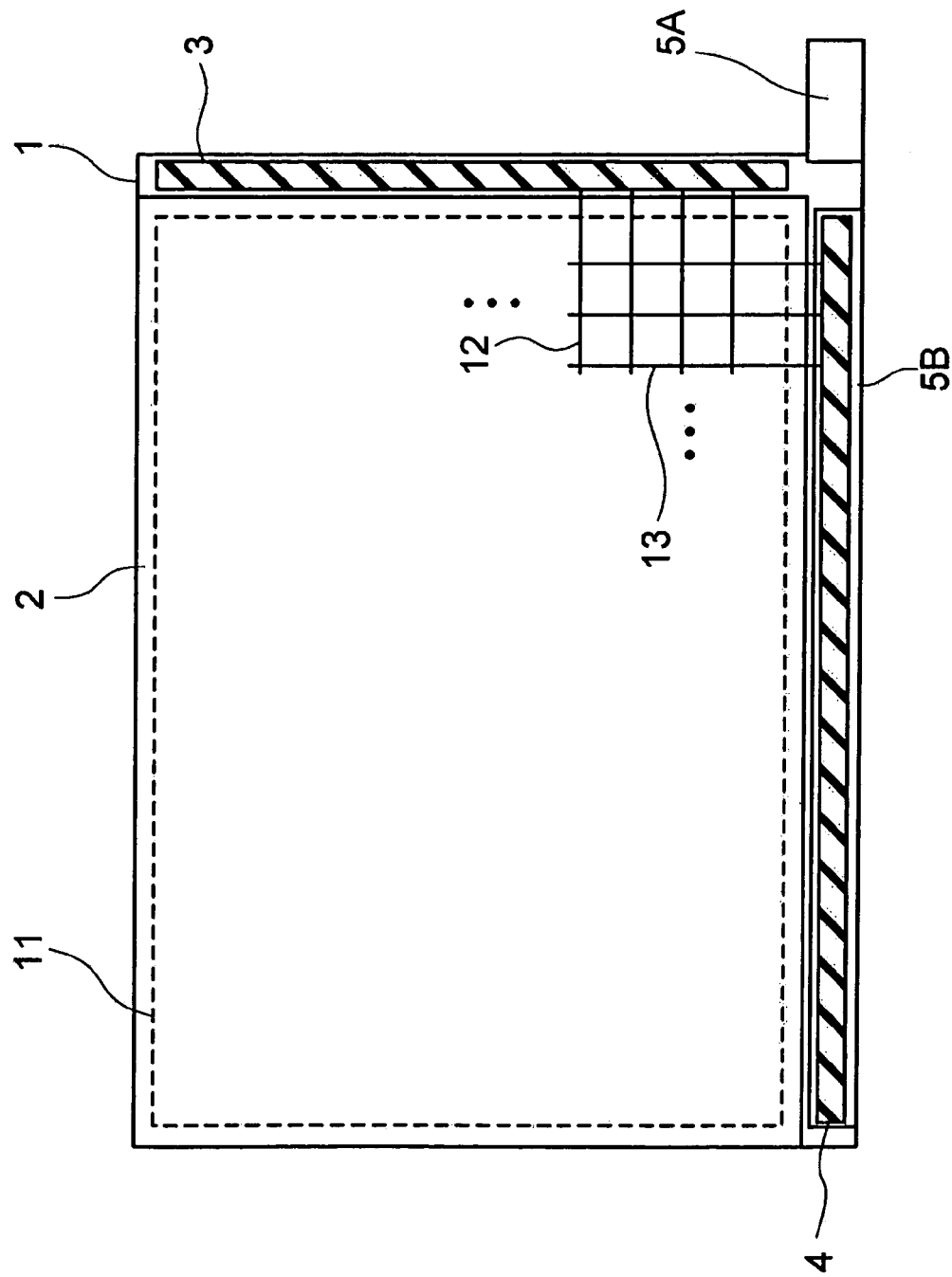
FIG. 15 is a plan view showing a liquid crystal display device of a sixth embodiment of the present invention, having a configuration in which semiconductor chips are mounted on flexible wiring boards.
Figure 16:
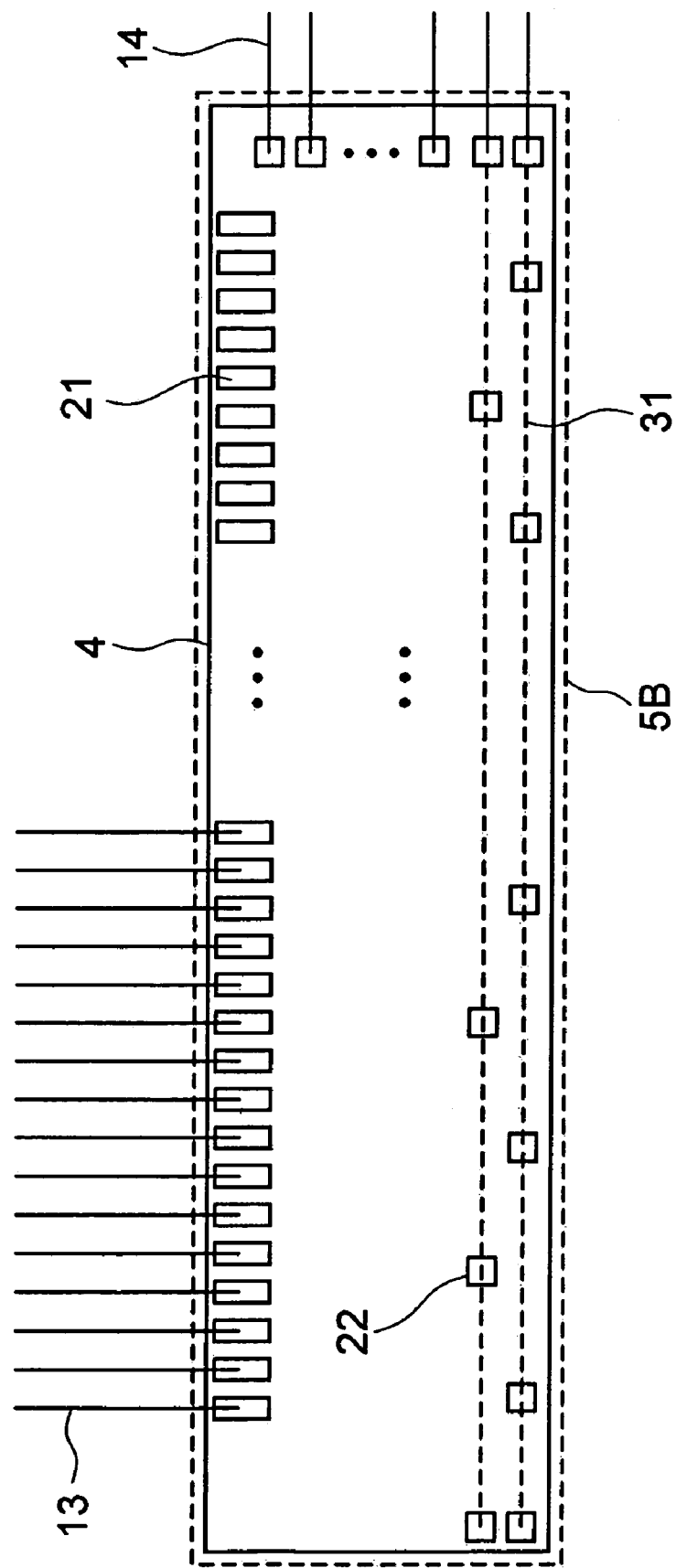
FIG. 16 is a plan view showing a semiconductor chip for driving signal lines, mounted on the liquid crystal display device of the sixth embodiment of the present invention having a configuration in which semiconductor chips are mounted on the flexible wiring boards.

FIG. 15 is plan view of a liquid crystal display device of a sixth embodiment of the present invention, and FIG. 16 is a plan view of the semiconductor chip 4 for driving signal lines shown in FIG. 15, showing the connecting relationship with the wirings.

The aspect different from FIG. 13 showing the fifth embodiment is as follows. That is, the flexible wirings 31, corresponding to the control/power supply lines 14, are formed on the flexible wiring board 5B mounted on the frame of the display unit 11. The semiconductor chip 4 is mounted on the flexible wiring board 5B, and the output terminals 21 of the semiconductor chip 4 are connected with the signal lines 13 of the display unit 11, respectively. Further, the connecting terminals 22 of the semiconductor chip 4 are connected with the flexible wirings 31. The connecting terminals 22 arranged on the short edge side of the semiconductor chip 5 are connected with the control/power supply lines 14 formed on the substrate 1. The control/power supply lines 14 are connected with control/power supply lines, not shown, on the flexible wiring board 5A. Other aspects are the same as those of the fifth embodiment.

With the configuration described above, the semiconductor chip 4 and the flexible wiring board 5B are mounted in a stacked manner on the substrate 1 of the display unit 11. Thereby, it is possible to narrow the frame width of display unit 11 comparing with the case where the semiconductor chip 4 and the flexible wiring board 5 are arranged in parallel as shown in FIG. 3.

Figure 17:
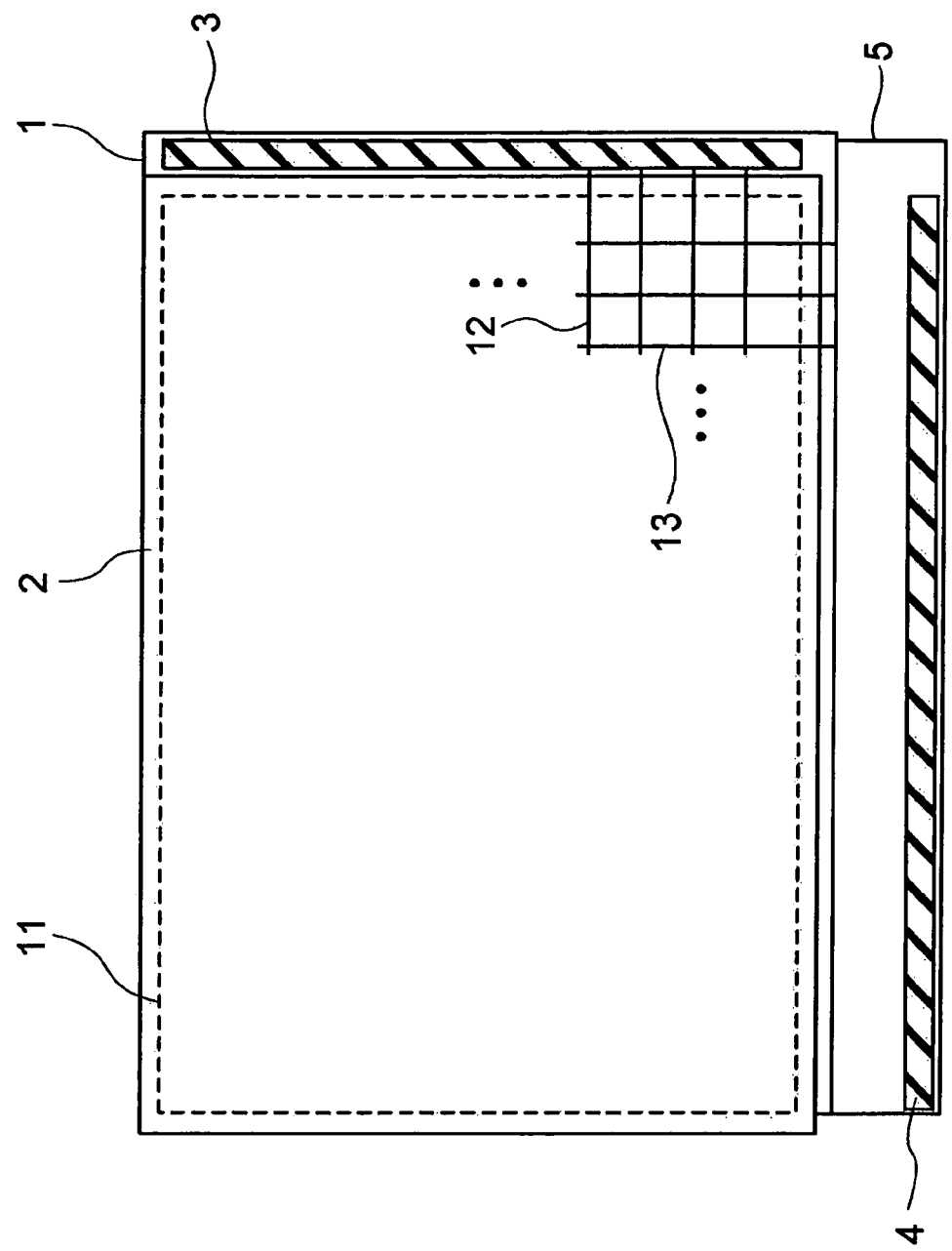
FIG. 17 is a plan view showing another mode of the liquid crystal display device of the sixth embodiment of the present invention, having a configuration in which semiconductor chips are mounted on the flexible wiring boards.
Figure 18:
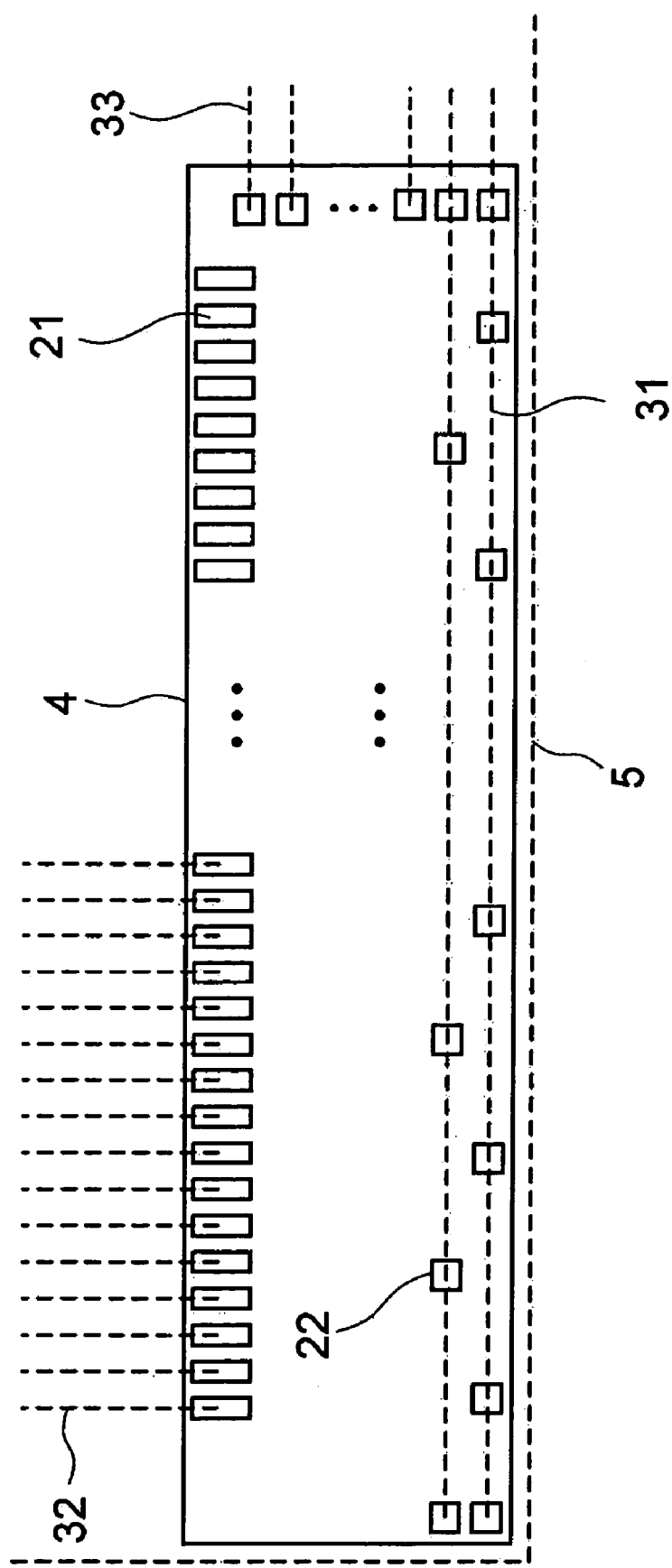
FIG. 18 a plan view showing a semiconductor chip for driving signal lines, mounted on another mode of the liquid crystal display device of the sixth embodiment of the present invention having a configuration in which semiconductor chips are mounted on the flexible wiring boards.

In the configuration shown in FIG. 15, the semiconductor chip 4 for driving signal lines and the flexible wiring board 5B are mounted in a stacked manner on the first substrate 1. However, the flexible wiring board 5B with narrow width shown in FIG. 16 may be substituted with the flexible wiring board 5 with wide width, as shown in FIGS. 17 and 18. In such a case, on the flexible wiring board 5, there are formed signal lines 32 of the flexible wiring board for connecting the output terminals 21 of the semiconductor chip 4 with the signal lines 13 of the display unit 11. Further, on the flexible wiring board 5, there are formed control/power supply lines 33 of the flexible wirings for connecting with the connecting terminals 22 of the semiconductor chip 4. The control/power supply lines 33 of the flexible wirings correspond to the control/power supply lines 14. With this configuration, the above-described effect can be achieved.

In the embodiment shown in FIGS. 19 and 20, the flexible wiring board 5 shown in FIG. 17 is substituted with a printed board 6. As shown in FIG. 20, on the printed board 6, there are provided signal lines 34a, printed board wirings 34b, and control/power supply lines 34c. The signal lines 34a correspond to the signal lines 32 shown in FIG. 18, the printed board wirings 34b correspond to the flexible wirings 31, and the control/power supply lines 34c correspond to the control/power supply lines 33 of the flexible wirings. Further, the signal lines 13 of the display unit 11 and the output terminals 21 of the semiconductor chip 4 are connected with each other via wirings of a flexible wiring board 5c. Other aspects in configuration are the same as those shown in FIG. 17. In this way, the aforementioned effects can be achieved by mounting the semiconductor chip 4 for driving signal lines on the printed board 6. Although a printed board is used in this example, the effects of the present invention can be achieved with glass substrates.

With the configuration described above, it is possible to narrow the width of the wirings within the semiconductor chips, and since the connecting terminals serve as dummy bumps, it is possible to provide the structure of semiconductor chip with a narrow width. Further, with the aforementioned two effects, it is possible to provide a display device with a narrower frame.

Although some embodiment of the present invention have been described, the structures of these embodiments may be combined within a range possible for respective structures. Further, although omitted, the semiconductor circuits (drive circuits) C1 and C2 are mounted on the semiconductor chips shown in FIGS. 4, 5, 6, 7, 9, 10, 11, 12, 14, 16, 18 and 20, as shown in FIGS. 2 and 3.

Although, in the respective embodiments of the present invention, there are embodiments in which the semiconductor chip 3 for driving scan lines or the semiconductor chip 4 for driving signal lines is used as an example of the structure of the semiconductor chip, the present invention is not limited to this. The present invention is capable of being applied to other semiconductor chips such as semiconductor chips for driving signal lines and semiconductor chips for driving scan lines.

Further, although a liquid crystal display device is used as an example in the embodiments of the present invention, the present invention is not limited to this. The present invention is capable of being applied to display devices, such as those using organic EL, having such a structure that drive circuit semiconductor chips are provided along the respective edges of the display device.

What is claimed is:

1. A semiconductor chip comprising:
 a chip body formed in an elongated shape mounted on a frame part of a display device;
 a semiconductor circuit, mounted on the chip body, for driving either of signal lines or scan lines of a display unit provided in the display device; and
 a plurality of first terminals provided on the chip body; wherein
 the plurality of first terminals are connected with at least one of a signal wiring or a power supply wiring of the display device, the at least one of a signal wiring or a power supply wiring formed on another substrate different from the chip body, and
 a plurality of second terminals connected with a same wiring from among the at least one of a signal wiring or a power supply wiring and are formed in alignment in a longitudinal direction of the chip body.

2. The semiconductor chip, as claimed in claim 1, further comprising:
 a first plurality of second terminals connected with a first wiring; and
 a second plurality of second terminals connected with a second wiring;
 wherein positions of the terminals connected with the first wiring and the second wiring are shifted in the longitudinal direction of the chip body such that terminals connected with the first wiring are not aligned in the longitudinal direction of the chip body with terminals connected with the second wiring.

3. The semiconductor chip, as claimed in claim 1, wherein the semiconductor circuit includes output terminals which are connected with the signal lines or the scan lines and are arranged in alignment near one long edge of the chip body, and
 the terminals formed in alignment in the longitudinal direction of the chip body are terminals for supplying at least either of signals or power to the semiconductor circuit, and are arranged near another long edge opposite the one long edge of the chip body.

4. The semiconductor chip, as claimed in claim 1, wherein the plurality of second terminals are formed in a single or a plurality of rows, and the wirings with which the plurality of second terminals are connected are provided in a plural number, and the terminals of each row are connected to each wiring in a corresponding manner.

5. The semiconductor chip, as claimed in claim 1, wherein the plurality of second terminals are formed in a single or a plurality of rows, and the wirings with which the plurality of second terminals are connected are provided in a plural number, and the plurality of wirings are connected to at least one of the plurality of terminal rows cyclically.

6. The semiconductor chip, as claimed in claim 3, wherein the chip body is divided into a plurality of pieces, and another signal wiring and power supply wiring are provided so as to pass through spaces between the terminals formed in alignment in the longitudinal direction of the chip body and the output terminals.

7. The semiconductor chip, as claimed in claim 3, wherein the chip body includes an inner circuit which generates at least either of a power supply voltage or a signal, and
 a wiring connected with the inner circuit is provided so as to pass through a space between the terminals formed in alignment in the longitudinal direction of the chip body and the output terminals.

8. The semiconductor chip, as claimed in claim 1, wherein plurality of rows of terminals, each of which is formed of the plurality of terminals connected to the same wiring, are spaced apart along a direction of a long edge side of the chip body.

9. The semiconductor chip, as claimed in claim 1, wherein assuming that an area of the terminal is X, a number of the at least one of the first plurality or second plurality of terminals is n, a wiring length of the wiring extending in the longitudinal direction of the chip body is L, an average width of the wiring is W, a minimum width of the wiring affordable in a producing process of the semiconductor chip is W1, and the wiring formed on the other substrate and the wiring formed on the chip body are made of a same material, the number n of the at least one of the first plurality or second plurality of terminals satisfies $n<(WL/X)(1/2)$.

10. The semiconductor chip, as claimed in claim 1, wherein assuming that an area of the terminal is X, a number of the at least one of the first plurality or second plurality of terminals is n, a wiring length of the wiring extending in the longitudinal direction of the chip body is L, an average width of the wiring is W, a minimum width of the wiring afforded in a producing process of the semiconductor chip is W1, and the wiring formed on the other substrate and the wiring formed on the chip body are made of a same material, the number n of the at least one of the first plurality or second plurality of terminals satisfies $n<W/W1$.

11. The semiconductor chip, as claimed in claim 1, wherein the other substrate is a substrate provided in the display device in which the chip body is mounted.

12. The semiconductor chip, as claimed in claim 1, wherein the other substrate is a flexible wiring board provided in parallel with the chip body.

13. The semiconductor chip, as claimed in claim 1, wherein the other substrate is a flexible wiring board on which the chip body is mounted.

14. The semiconductor chip, as claimed in claim 11, wherein a printed board is used instead of the flexible wiring board.

15. The semiconductor chip, as claimed in claim 1, wherein the chip body is a glass substrate.

16. A display device comprising:
 a display unit formed inside a frame part of the display device;
 a plurality of pixels which are formed within the display unit and are drive-controlled by drive signals from signal lines and scan lines; and
a semiconductor chip according to claim 1 which is mounted on the frame part surrounding the display unit.

17. The display device, as claimed in claim 16, wherein terminals provided on the semiconductor chip are connected to corresponding signal lines, scan lines, signal wirings, and power supply lines provided in the display device, respectively.

* * * * *